(12) United States Patent
Ogawa

(10) Patent No.: US 11,538,959 B2
(45) Date of Patent: Dec. 27, 2022

(54) DISPLAY DEVICE COMPRISING PLURALITY OF LIGHT EMITTING ELEMENTS OVERLAPPING WITH CONTACT ELECTRODES

(71) Applicant: Japan Display Inc., Tokyo (JP)

(72) Inventor: Akihiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/029,695

(22) Filed: Sep. 23, 2020

(65) Prior Publication Data

US 2021/0091260 A1 Mar. 25, 2021

(30) Foreign Application Priority Data

Sep. 24, 2019 (JP) .............................. JP2019-173422

(51) Int. Cl.
| | | |
|---|---|---|
| *H01L 21/00* | (2006.01) | |
| *H01L 33/00* | (2010.01) | |
| *H01L 21/66* | (2006.01) | |
| *H01L 25/075* | (2006.01) | |
| *H01L 33/62* | (2010.01) | |
| *H01L 27/12* | (2006.01) | |
| *G09G 3/32* | (2016.01) | |

(52) U.S. Cl.
CPC .......... *H01L 33/0095* (2013.01); *H01L 22/22* (2013.01); *H01L 25/0753* (2013.01); *H01L 27/1214* (2013.01); *H01L 33/62* (2013.01); *G09G 3/32* (2013.01); *G09G 2310/0264* (2013.01); *H01L 2933/0066* (2013.01)

(58) Field of Classification Search
CPC . H01L 25/0753; H01L 27/1214; H01L 33/62; H01L 2933/0066; H01L 27/156; H01L 33/48; H01L 2933/0033; G09G 3/32; G09G 2310/0264; G09G 2300/0819; G09G 2300/0842; G09G 2300/0852; G09G 2300/0861; G09G 2310/0251; G09F 9/33

See application file for complete search history.

(56) References Cited

U.S. PATENT DOCUMENTS

| | | | | |
|---|---|---|---|---|
| 5,647,966 | A * | 7/1997 | Uriu ....................... | H01F 41/042 205/78 |
| 2017/0125374 | A1* | 5/2017 | Lin ....................... | B23K 1/0053 |
| 2017/0213502 | A1 | 7/2017 | Henry et al. | |
| 2020/0058834 | A1* | 2/2020 | Park ....................... | H01L 33/56 |
| 2020/0126477 | A1 | 4/2020 | Henry et al. | |

FOREIGN PATENT DOCUMENTS

JP 2017-529557 A 10/2017

* cited by examiner

*Primary Examiner* — Ismail A Muse
(74) *Attorney, Agent, or Firm* — K&L Gates LLP

(57) ABSTRACT

A method for repairing a display device, the display device including a plurality of inorganic light emitting elements arranged in a matrix and an insulator arranged around the plurality of inorganic light emitting elements, the method comprising steps of: detecting a defective inorganic light emitting element as the inorganic light emitting element having a defect; removing the insulator around the defective inorganic light emitting element while the defective inorganic light emitting element remains without being removed by irradiating the insulator around the defective inorganic light emitting element with irradiation light; and removing the defective inorganic light emitting element after the insulator therearound has been removed.

6 Claims, 14 Drawing Sheets

DISPLAY DEVICE COMPRISING PLURALITY OF LIGHT EMITTING ELEMENTS OVERLAPPING WITH CONTACT ELECTRODES

CROSS-REFERENCE TO RELATED APPLICATION

This application claims priority from Japanese Application No. 2019-173422, filed on Sep. 24, 2019, the contents of which are incorporated by reference herein in its entirety.

BACKGROUND

1. Technical Field

The present disclosure relates to a method for repairing a display device.

2. Description of the Related Art

In recent years, display devices using fine-sized light emitting diodes (micro LEDs) as display elements have attracted attention (for example, see Japanese Translation of PCT International Application Publication No. 2017-529557 (JP-T-2017-529557). A plurality of LEDs are coupled to an array substrate (a driver backplane in JP-T-2017-529557), and the array substrate includes a pixel circuit (an electronic control circuit in JP-T-2017-529557) for driving the LEDs.

It is difficult to manufacture the display device using the LEDs due to mounting of the LEDs on a substrate because the size of the LEDs is small and so on, and defects of the LEDs tend to be generated. When the display device having the defect is discarded and so on and is not used, a yield is lowered. For this reason, the display device using the LEDs needs to be properly usable even when a defect is generated.

The present disclosure has been made in view of the above-mentioned problem, and an object thereof is to provide a method for repairing a display device, the method enabling the display device to be properly usable even when a defect is generated.

SUMMARY

A method for repairing a display device according to one embodiment of the present disclosure is disclosed. The display device includes a plurality of inorganic light emitting elements arranged in a matrix and an insulator arranged around the plurality of inorganic light emitting elements. The method includes steps of detecting a defective inorganic light emitting element as the inorganic light emitting element having a defect, removing the insulator around the defective inorganic light emitting element while the defective inorganic light emitting element remains without being removed by irradiating the insulator around the defective inorganic light emitting element with irradiation light, and removing the defective inorganic light emitting element after the insulator therearound has been removed.

DETAILED DESCRIPTION

Figure 1:
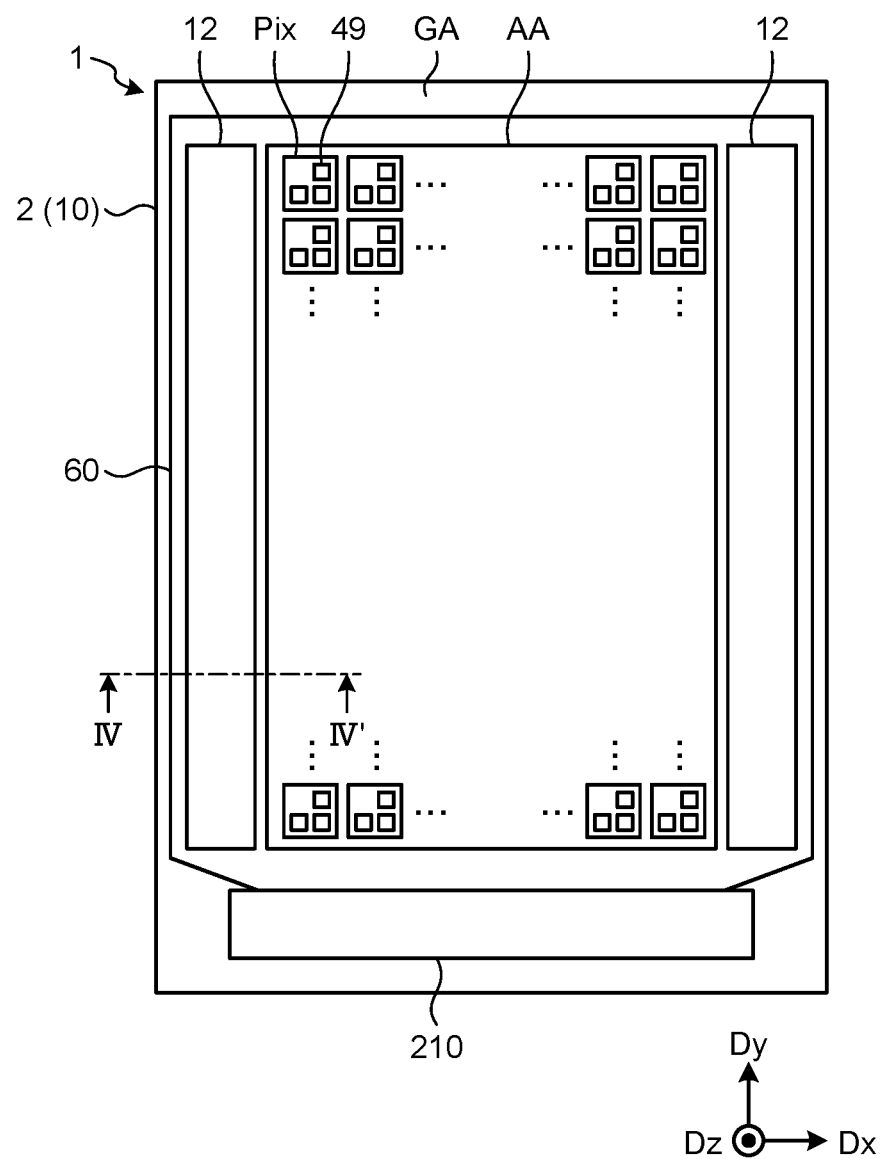
FIG. 1 is a plan view illustrating an example of the configuration of a display device according to an embodiment.

Hereinafter, an embodiment of the present disclosure will be described with reference to the drawings. The disclosure is merely an example and it is needless to say that appropriate modifications within the gist of the disclosure at which those skilled in the art can easily arrive are encompassed in the range of the present disclosure. In the drawings, widths, thicknesses, shapes, and the like of components can be schematically illustrated in comparison with actual modes, for more clear explanation. They are, however, merely examples and do not limit interpretation of the present disclosure. In the present specification and the drawings, the same reference numerals denote components similar to those described before with reference to the drawing that has been already referred and detail explanation thereof can be appropriately omitted.

Configuration of Display Device

FIG. 1 is a plan view illustrating an example of the configuration of a display device according to the embodiment. As illustrated in FIG. 1, a display device 1 includes an array substrate 2, pixels Pix, drive circuits 12, a drive integrated circuit (IC) 210, and a cathode wire 60. The array substrate 2 is a drive circuit substrate for driving the pixels Pix and is also referred to as a backplane or an active matrix substrate. The array substrate 2 has a substrate 10, a plurality of transistors, a plurality of capacitors, various wires, and the like.

As illustrated in FIG. 1, the display device 1 has a display region AA and a peripheral region GA. The display region AA is a region where the pixels Pix are arranged and an image is displayed. The peripheral region GA is a region that does not overlap with the pixels Pix and is disposed outside the display region AA.

The pixels Pix are arrayed in a first direction Dx and a second direction Dy in the display region AA of the substrate 10. The first direction Dx and the second direction Dy are parallel with a first surface 10a (see FIG. 4) of the substrate 10 of the array substrate 2. The first direction Dx is orthogonal to the second direction Dy. The first direction Dx may not be orthogonal to but intersect with the second direction Dy. A third direction Dz is orthogonal to the first direction Dx and the second direction Dy. The third direction Dz corresponds to the normal direction of the substrate 10, for example. Hereinafter, plan view indicates a positional relation when seen from the third direction Dz.

The drive circuits 12 are provided in the peripheral region GA of the substrate 10. The drive circuits 12 drive a plurality of gate lines (for example, light emission control scan lines BG, reset control scan lines RG, initialization control scan lines IG, and write control scan lines SG (see FIG. 3)) on the basis of various control signals from the drive IC 210. The drive circuits 12 select the gate lines in order or simultaneously and supply gate drive signals to the selected gate lines. The drive circuits 12 thereby select the pixels Pix coupled to the gate lines.

The drive IC 210 controls display of the display device 1. The drive IC 210 may be mounted as a chip on glass (COG) in the peripheral region GA of the substrate 10. A mounting manner of the drive IC 210 is not limited thereto, and it may be mounted as a chip on film (COF) on a wiring substrate coupled to the peripheral region GA of the substrate 10. The wiring substrate that is coupled to the substrate 10 is, for example, a flexible printed substrate or a rigid substrate.

The cathode wire 60 is provided in the peripheral region GA of the substrate 10. The cathode wire 60 is provided so as to surround the pixels Pix in the display region AA and the drive circuits 12 in the peripheral region GA. Cathodes (cathode electrodes 114 (see FIG. 4)) of a plurality of inorganic light emitting bodies 100 are coupled to the common cathode wire 60, and a fixed potential (for example, a ground potential) is supplied thereto. To be more specific, the cathode electrodes 114 of the inorganic light emitting bodies 100 are coupled to the cathode wire 60 via a counter cathode electrode 90e above the array substrate 2. A cathode wire 14 may have a slit in a part thereof and be formed by two different wires above the substrate 10.

Figure 2:
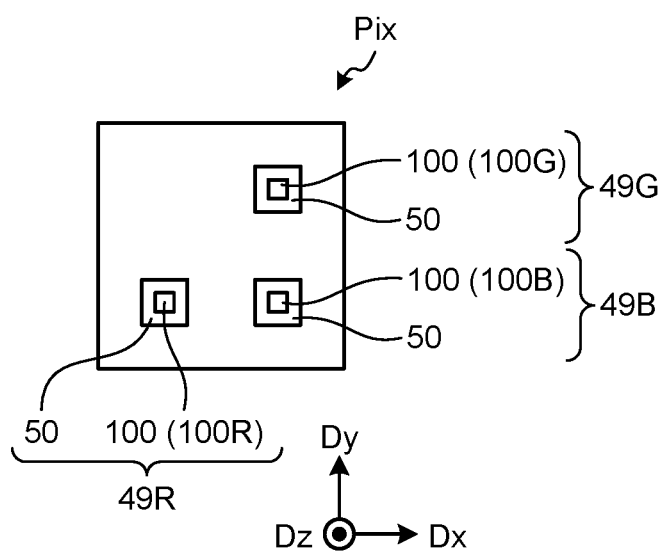
FIG. 2 is a plan view illustrating a plurality of pixels.

FIG. 2 is a plan view illustrating a plurality of pixels. As illustrated in FIG. 2, one pixel Pix has a plurality of pixels 49. For example, the pixel Pix has a first pixel 49R, a second pixel 49G, and a third pixel 49B. The first pixel 49R displays red of a primary color as a first color. The second pixel 49G displays green of a primary color as a second color. The third pixel 49B displays blue of a primary color as a third color. As illustrated in FIG. 2, the first pixel 49R and the third pixel 49B are arrayed in the first direction Dx in one pixel Pix. The second pixel 49G and the third pixel 49B are arrayed in the second direction Dy. The first color, the second color, and the third color are not limited to red, green, and blue, respectively, and desired colors such as complementary colors can be selected therefor. Hereinafter, when the first pixel 49R, the second pixel 49G, and the third pixel 49B need not to be distinguished from one another, they are referred to as pixels 49. The number of pixels 49 included in one pixel Pix is not limited to three, and equal to or more than four pixels 49 may be associated with one pixel Pix. For example, one pixel Pix may include a fourth pixel 49W with which white as a fourth color is associated. Arrangement of the pixels 49 is not limited to the configuration illustrated in FIG. 2. For example, the first pixel 49R may be adjacent to the second pixel 49G in the first direction Dx. The first pixels 49R, the second pixels 49G, and the third pixels 49B may be repeatedly arrayed in this order in the first direction Dx.

Each pixel 49 has the inorganic light emitting body 100. The display device 1 outputs light components differing among the inorganic light emitting bodies 100 in the first pixels 49R, the second pixels 49G, and the third pixels 49B to display an image. The inorganic light emitting body 100 is an inorganic light emitting diode (LED) chip having a size of several μm to 300 μm in plan view. In general, the LED chip having one chip size of equal to or more than 100 μm is referred to as a mini LED, and the LED chip having a size of less than 100 μm to several μm is referred to as a micro LED. In the present disclosure, LEDs having a desired size can be used and may be used in accordance with a screen size (size of one pixel) of the display device. The display device including the micro LEDs for the respective pixels is also referred to as a micro LED display device. The micro of the micro LED does not limit the size of the inorganic light emitting body 100.

Figure 3:
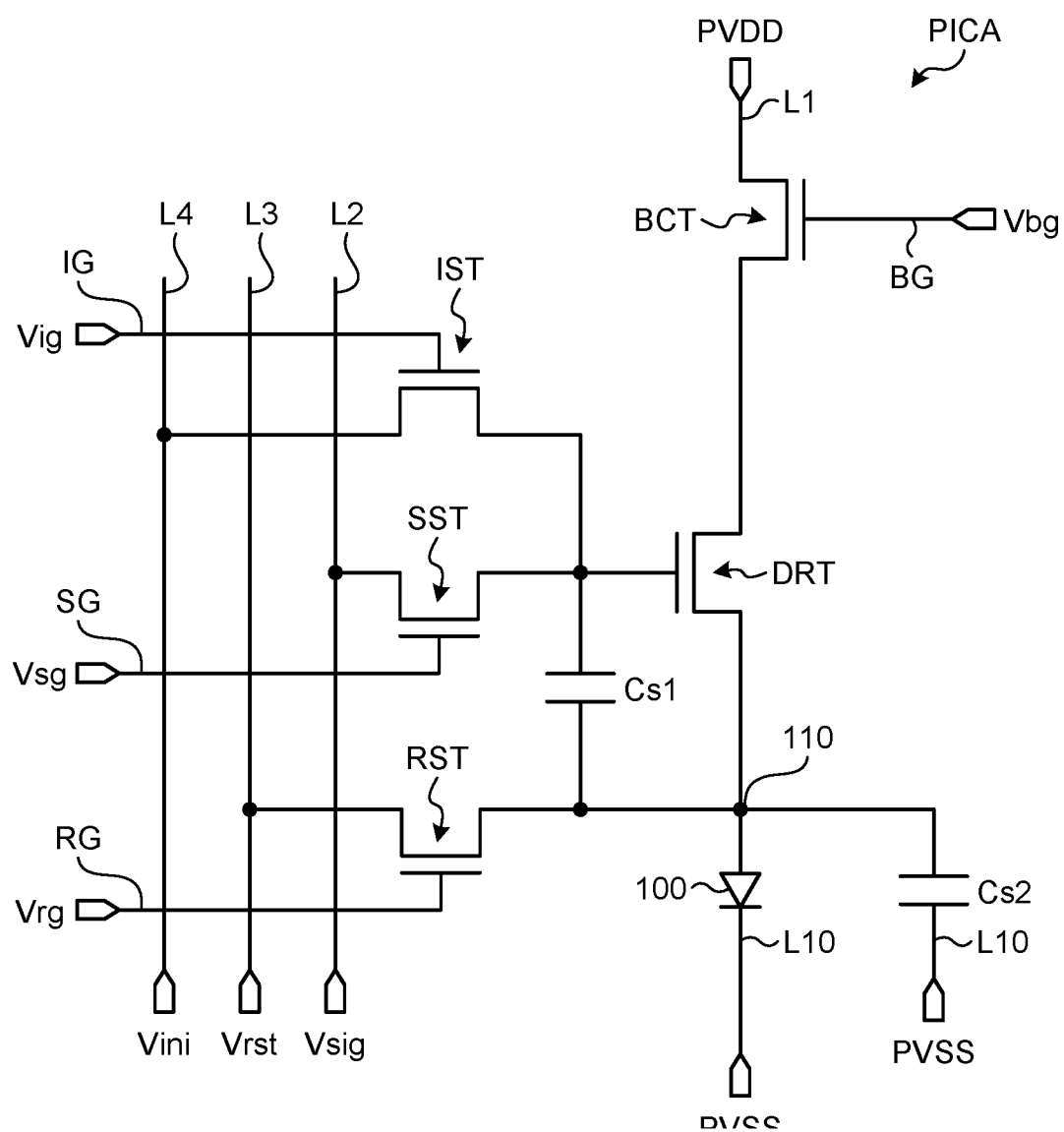
FIG. 3 is a circuit diagram illustrating an example of the configuration of a pixel circuit of the display device.

FIG. 3 is a circuit diagram illustrating an example of the configuration of a pixel circuit of the display device. A pixel circuit PICA illustrated in FIG. 3 is provided in each of the first pixels 49R, the second pixels 49G, and the third pixels 49B. The pixel circuit PICA is provided on the substrate 10 and supplies drive signals (currents) to the inorganic light emitting bodies 100. In FIG. 3, explanation for the pixel circuit PICA is applicable to the pixel circuit PICA included in each of the first pixels 49R, the second pixels 49G, and the third pixels 49B.

As illustrated in FIG. 3, the pixel circuit PICA includes the inorganic light emitting body 100, five transistors, and two capacitors. To be specific, the pixel circuit PICA includes a light emission control transistor BCT, an initialization transistor IST, a write transistor SST, a reset transistor RST, and a drive transistor DRT. Some transistors may be shared by the adjacent pixels 49. For example, the light emission control transistor BCT may be shared by three pixels 49 via a common wire. The reset transistors RST may be provided in the peripheral region GA, and one reset transistor RST may be provided for each row of the pixels 49, for example. In this case, each reset transistor RST is coupled to the drains of the drive transistors DRT via a common wire. The reset transistor RST may be coupled to the sources of the drive transistors DRT.

The respective transistors included in the pixel circuit PICA are formed by n-type thin film transistors (TFTs). The transistors are not, however, limited to being formed thereby and may be formed by p-type TFTs. When the p-type TFTs are used, coupling of a power supply potential and a storage capacitor Cs1 and a capacitor Cs2 may be appropriately adapted.

The light emission control scan line BG is coupled to the gate of the light emission control transistor BCT. The initialization control scan line IG is coupled to the gate of the initialization transistor IST. The write control scan line SG is coupled to the gate of the write transistor SST. The reset control scan line RG is coupled to the gate of the reset transistor RST.

Each of the light emission control scan line BG, the initialization control scan line IG, the write control scan line SG, and the reset control scan line RG is coupled to the drive circuits 12 (see FIG. 1). The drive circuits 12 supply a light emission control signal Vbg, an initialization control signal Vig, a write control signal Vsg, and a reset control signal Vrg to the light emission control scan line BG, the initialization control scan line IG, the write control scan line SG, and the reset control scan line RG, respectively. The drive IC 210 (see FIG. 1) supplies video image signals Vsig to the pixel circuits PICA included in the first pixels 49R, the second pixels 49G, and the third pixels 49B in a time division manner. Switch circuits such as multiplexers are provided between the respective rows of the first pixels 49R, the second pixels 49G, and the third pixels 49B and the drive IC 210. The video image signals Vsig are supplied to the write transistors SST via video image signal lines L2. The drive IC 210 supplies reset power supply potentials Vrst to the reset transistors RST via reset signal lines L3. The drive IC 210 supplies initialization potentials Vini to the initialization transistors IST via initialization signal lines L4.

The light emission control transistor BCT, the initialization transistor IST, the write transistor SST, and the reset transistor RST function as switching elements for selecting conduction and non-conduction between two nodes. The drive transistor DRT functions as a current control element for controlling the current flowing through the inorganic light emitting body 100 in accordance with a voltage between the gate and the drain thereof.

A cathode (cathode electrode 114) of the inorganic light emitting body 100 is coupled to a cathode power supply line L10. An anode (anode electrode 112) of the inorganic light emitting body 100 is coupled to an anode power supply line L1 (first power supply line) via the drive transistor DRT and the light emission control transistor BCT. An anode power supply potential PVDD (first potential) is supplied to the anode power supply line L1. A cathode power supply potential PVSS (second potential) is supplied to the cathode power supply line L10. The anode power supply potential PVDD is higher than the cathode power supply potential PVSS. The cathode power supply line L10 includes the cathode wire 60.

The pixel circuit PICA includes the capacitor Cs1 and the capacitor Cs2. The capacitor Cs1 is a storage capacitor formed between the gate and the source of the drive transistor DRT. The capacitor Cs2 is an additional capacitor formed between the source of the drive transistor DRT and the anode of the inorganic light emitting body 100, and the cathode power supply line L10.

The pixel circuit PICA may include a transistor CCT between the light emission control transistor BCT and the drive transistor DRT. In this case, the source of the transistor CCT is coupled to the drain of the light emission control transistor BCT, and the drain of the transistor CCT is coupled to the source of the drive transistor DRT. A wire CG for supplying a potential to the gate of the transistor CCT is coupled to the gate of the transistor CCT. When the potential is supplied to the gate of the transistor CCT via the wire CG, the drain of the light emission control transistor BCT and the source of the drive transistor DRT are made into a conduction state. On the other hand, when no potential is supplied to the gate of the transistor CCT via the wire CG, the drain of the light emission control transistor BCT and the source of the drive transistor DRT are made into a non-conduction state.

The display device 1 drives the pixels 49 of a first row to the pixels 49 of a final row to display an image for one frame in one frame period.

In a reset period, respective control signals that are supplied from the drive circuits 12 cause the potentials of the light emission control scan lines BG to be a low (L) level and cause the potentials of the reset control scan lines RG to be a high (H) level. Accordingly, the light emission control transistors BCT are turned OFF (non-conduction state), and the reset transistors RST are turned ON (conduction state).

With these states, electric charges remaining in the pixels 49 flow to the outside through the reset transistors RST, and the sources of the drive transistors DRT are fixed to the reset power supply voltage Vrst. The reset power supply voltage Vrst is set so as to have a predetermined potential difference from the cathode power supply potential PVSS. In this case, the potential difference between the reset power supply potential Vrst and the cathode power supply potential PVSS is less than a potential difference at which the inorganic light emitting bodies 100 start light emission.

Then, respective control signals that are supplied from the drive circuits 12 cause the potentials of the initialization control scan lines IG to be the H level. The initialization transistors IST are turned ON. The gates of the drive transistors DRT are fixed to the initialization potential Vini via the initialization transistors IST.

Then, respective control signals that are supplied from the drive circuits 12 cause the potentials of the initialization control scan lines IG to be the H level. The initialization transistors IST are turned ON. The gates of the drive transistors DRT are fixed to the initialization potential Vini via the initialization transistors IST.

The drive circuits 12 turn the light emission control transistors BCT ON and turns the reset transistors RST OFF. The drive transistors DRT are turned OFF when source potentials thereof become (Vini−Vth). A threshold voltage Vth of the drive transistor DRT can thereby be acquired for each pixel 49, and variation in the threshold voltage Vth among the pixels 49 is offset.

Subsequently, in a video image signal writing operation period, respective control signals that are supplied from the drive circuits 12 turn the light emission control transistors BCT OFF, turn the initialization transistors IST OFF, and turn the write transistors SST ON. In the pixels 49 belonging to one row, the video image signals Vsig are input to the gates of the drive transistors DRT. The video image signal line L2 extends in the second direction Dy and is coupled to the pixels 49 of a plurality of rows that belong to the same column. The video image signal writing operation period is therefore executed for each row.

In a light emission operation period, respective control signals that are supplied from the drive circuits 12 turn the light emission control transistors BCT ON and turn the write transistors SST OFF. The anode power supply potentials PVDD are supplied from the anode power supply lines L1 to the drive transistors DRT via the light emission control transistors BCT. The drive transistors DRT supply, to the inorganic light emitting bodies 100, currents in accordance with voltages between the gates and the sources thereof. Each inorganic light emitting body 100 emits light with luminance in accordance with the current.

The drive circuits 12 may drive the pixels 49 for each row, drive the pixels 49 for two rows simultaneously, or drive the pixels 49 for equal to or more than three rows simultaneously.

The above-mentioned configuration of the pixel circuit PICA illustrated in FIG. 3 is merely an example and can be appropriately modified. For example, the number of wires and the number of transistors in one pixel 49 may be different. The pixel circuit PICA can also employ the configuration of a current mirror circuit or the like.

Figure 4:
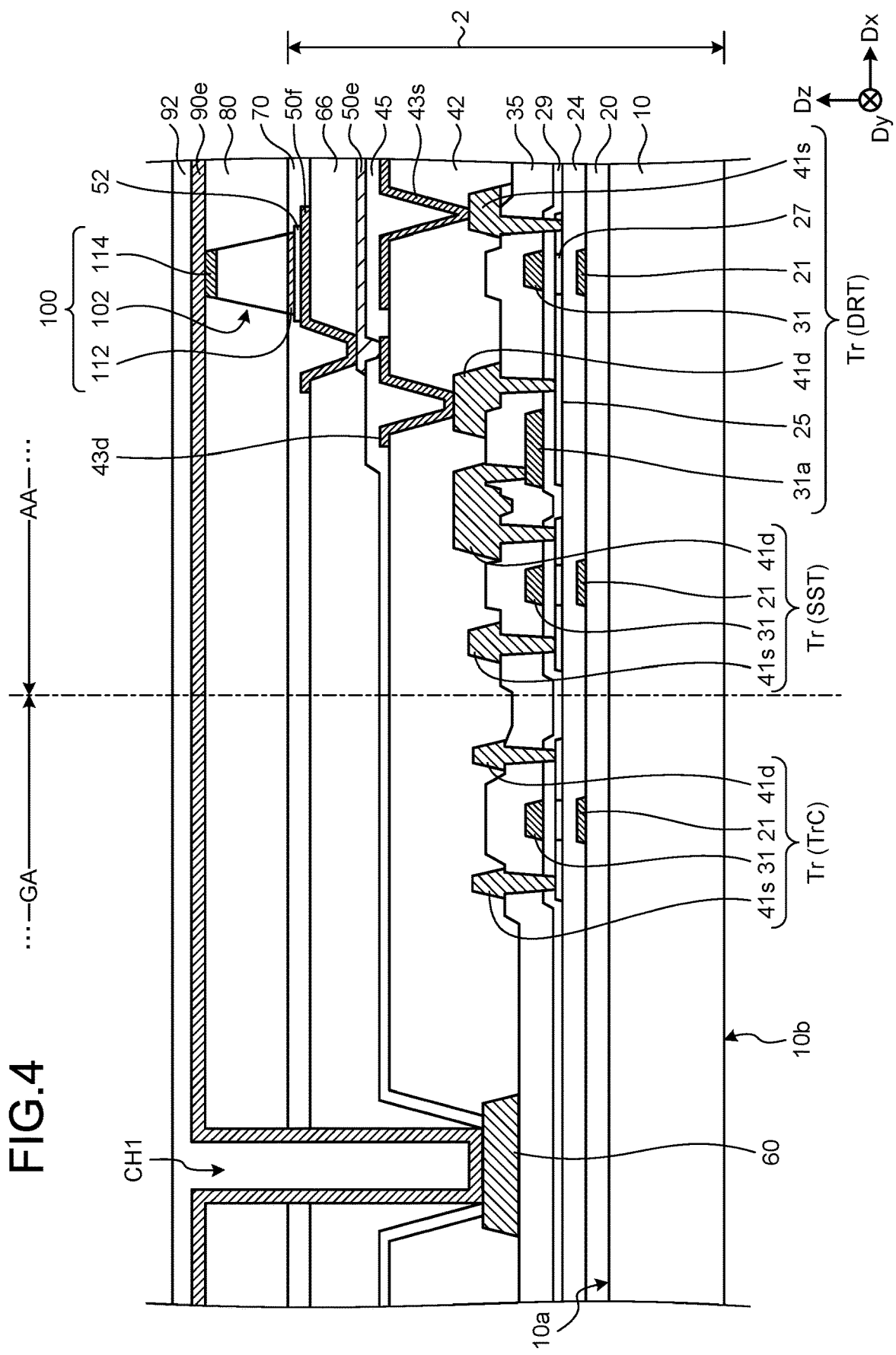
FIG. 4 is a cross-sectional view cut along line IV-IV' in FIG. 1.

FIG. 4 is a cross-sectional view cut along line IV-IV' in FIG. 1. As illustrated in FIG. 4, the array substrate 2 of the display device 1 includes the substrate 10 and the transistors. The substrate 10 has the first surface 10a and a second surface 10b on the opposite side to the first surface 10a. The substrate 10 is an insulating substrate and is, for example, a glass substrate, a quartz substrate, or a flexible substrate made of acrylic resin, epoxy resin, polyimide resin, or polyethylene terephthalate (PET) resin.

In the present specification, the direction toward the inorganic light emitting bodies 100 from the substrate 10 in the direction perpendicular to the surface of the substrate 10 is an "upper-side direction" or simply an "upward direction". The direction toward the substrate 10 from the inorganic light emitting bodies 100 is a "lower-side direction" or simply a "downward direction". When a mode in which another structure is disposed above a certain structure is represented, simple expression "above" includes both of the case in which another structure is disposed on the certain structure so as to make contact with the certain structure and the case in which another structure is disposed above the certain structure with still another structure interposed therebetween unless otherwise specified.

An undercoat layer 20 is provided above the first surface 10a of the substrate 10. A light shielding layer may be provided above the first surface 10a of the substrate 10. In this case, the undercoat layer 20 covers the light shielding layer. The light shielding layer may be made of a desired material as long as it shields light and may be formed by a molybdenum-tungsten alloy film, for example.

The transistors are provided above the undercoat layer 20. For example, the drive transistors DRT and the write transistors SST included in the pixels 49 as the transistors are provided in the display region AA of the substrate 10. Transistors TrC included in the drive circuits 12 are provided as the transistors in the peripheral region GA of the substrate 10. Among the transistors, the drive transistor DRT, the write transistor SST, and the transistor TrC are illustrated but the light emission control transistor BCT, the initialization transistor IST, and the reset transistor RST included in the pixel circuit PICA have similar multilayered structures as that of the drive transistor DRT. In the following description, when the transistors need not to be distinguished from one another for description, they are simply expressed as transistors Tr.

The transistors Tr are TFTs having double-sided gate structures, for example. Each of the transistors Tr has a first gate electrode 21, a second gate electrode 31, a semiconductor layer 25, a source electrode 41s, and a drain electrode 41d. The first gate electrodes 21 are provided above the undercoat layer 20. An insulating film 24 is provided above the undercoat layer 20 and covers the first gate electrodes 21. The semiconductor layers 25 are provided above the insulating film 24. The semiconductor layers 25 are made of, for example, polysilicon. The semiconductor layers 25 are not limited thereto and may be microcrystalline oxide semiconductors, amorphous oxide semiconductors, low-temperature polysilicon, or the like. An insulating film 29 is provided above the semiconductor layers 25. The second gate electrodes 31 are provided above the insulating film 29.

The undercoat layer 20 and the insulating films 24, 29, and 45 are inorganic insulating films and are made of, for example, silicon oxide ($SiO_2$) or silicon nitride (SiN). The first gate electrodes 21 and the second gate electrodes 31 oppose each other in the third direction Dz with the insulating film 24, the semiconductor layers 25, and the insulating film 29 interposed therebetween. Portions of the insulating films 24 and 29 that are interposed between the first gate electrodes 21 and the second gate electrodes 31 function as gate insulating films. Portions of the semiconductor layers 25 that are interposed between the first gate electrodes 21 and the second gate electrodes 31 function as channel regions 27 of the transistors Tr. Portions of the semiconductor layers 25 that are coupled to the source electrodes 41s are source regions of the transistors Tr, and portions thereof that are coupled to the drain electrodes 41d are drain regions of the transistors Tr. Low-concentration impurity regions are provided between the channel regions 27 and the source regions and between the channel regions 27 and the drain regions. Although only n-type TFTs are indicated as the transistors Tr, p-type TFTs may be formed at the same time.

Gate lines 31a are coupled to the second gate electrodes 31 of the drive transistors DRT. The insulating film 29 is provided between the substrate 10 and the gate lines 31a, and the capacitors CS are formed between the gate lines 31a and the substrate 10. The first gate electrodes 21, the second gate electrodes 31, and the gate lines 31a are made of, for example, aluminum (Al), copper (Cu), silver (Ag), molybdenum (Mo), or an alloy film thereof.

In the embodiment, the transistors Tr are not limited to having the double-sided gate structures. The transistors Tr may be bottom gate-type transistors in which the gate electrodes are formed by only the first gate electrodes 21. The transistors Tr may be top gate-type transistors in which the gate electrodes are formed by only the second gate electrodes 31. The undercoat layer 20 may not be provided.

The display device 1 includes an insulating film 35 that is provided above the first surface 10a of the substrate 10 and covers the transistors Tr. The source electrodes 41s are provided above the insulating film 35 and are coupled to the sources of the transistors Tr via through-holes provided in the insulating film 35. The drain electrodes 41d are provided above the insulating film 35 and are coupled to the drains of the transistors Tr via through-holes provided in the insulating film 35. The cathode wire 60 is provided above the insulating film 35 in the peripheral region GA. An insulating film 42 covers the source electrodes 41s, the drain electrodes 41d, and the cathode wire 60. The insulating film 35 is an inorganic insulating film, and the insulating film 42 is an organic insulating film. The source electrodes 41s and the drain electrodes 41d are formed by a multilayered film of TiAlTi or TiAl as a multilayered structure of titanium and aluminum. The insulating film 42 is made of an organic material such as photosensitive acrylic.

Parts of the source electrodes 41s are formed in regions overlapping with the gate lines 31a. The gate lines 31a and the source electrodes 41s opposing each other with the insulating film 35 interposed therebetween form the capacitors Cs1. The gate lines 31a are formed in regions overlapping with parts of the semiconductor layers 25. The capacitors Cs1 also include capacitors formed by the semiconductor layers 25 and the gate lines 31a opposing each other with the insulating film 24 interposed therebetween.

The display device 1 includes source coupling wires 43s, drain coupling wires 43d, an insulating film 45, counter anode electrodes 50e, an insulating film 66, coupling layers 50f, coupling conductive parts 52, the inorganic light emitting bodies 100, an insulating film 70, a flattening film 80, the counter cathode electrode 90e, and a cover portion 92. The source coupling wires 43s are provided above the insulating film 42 and are coupled to the source electrodes 41s via through-holes provided in the insulating film 42. The drain coupling wires 43d are provided above the insulating film 42 and are coupled to the drain electrodes 41d via through-holes provided in the insulating film 42. The insulating film 45 is provided above the insulating film 42 and covers the source coupling wires 43s and the drain coupling wires 43d. The counter anode electrodes 50e are provided above the insulating film 45 and are coupled to the drain coupling wires 43d of the drive transistors DRT via through-holes provided in the insulating film 45. The source coupling wires 43s and the drain coupling wires 43d are formed by, for example, transparent conductors made of indium tin oxide (ITO) or the like.

The insulating film 66 is provided above the insulating film 45 and covers the counter anode electrodes 50e. The coupling layers 50f are provided above the insulating film 66 and are coupled to the counter anode electrodes 50e via through-holes provided in the insulating film 66. The coupling conductive parts 52 are provided on the coupling layers 50f. The inorganic light emitting bodies 100 are provided above the coupling conductive parts 52, and the counter anode electrodes 50e are coupled to the anode electrodes 112 of the inorganic light emitting bodies 100 via the coupling layers 50f and the coupling conductive parts 52. The capacitors Cs2 are formed between the counter anode electrodes 50e and the source coupling wires 43s opposing each other with the insulating film 45 interposed therebetween.

The insulating film 70 is provided above the insulating film 45 and covers the coupling layers 50f, the coupling conductive parts 52, the side surfaces of the anode electrodes 112 of the inorganic light emitting bodies 100. The insulating film 70 has openings for mounting the inorganic light emitting bodies 100 at positions overlapping with the anode electrodes 112. The area of each opening of the insulating film 70 is larger than the size of a surface connecting each inorganic light emitting body 100 with the counter anode electrode 50e in plan view. Each counter anode electrode 50e is larger than the surface connecting the inorganic light emitting body 100 with the counter anode electrode 50e in plan view. The flattening film 80 is provided above the insulating film 70 and covers the side surfaces of the inorganic light emitting bodies 100. The counter cathode electrode 90e is provided above the flattening film 80. The insulating film 70 is an inorganic insulating film and is made of, for example, a silicon nitride film (SiN). The flattening film 80 is an organic insulating film or an organic/inorganic hybrid insulating film (material in which, for example, an organic group (a methyl group or a phenyl group) is bonded to a Si—O main chain). The upper surfaces (cathode electrodes 114) of the inorganic light emitting bodies 100 are exposed from the flattening film 80. The counter cathode electrode 90e is coupled to the cathode electrodes 114 of the inorganic light emitting bodies 100. Hereinafter, when the insulating film 70 and the flattening film 80 are not distinguished from each other, they are referred to as an insulator 72. The insulator 72 is considered to be provided around the inorganic light emitting bodies 100. In the embodiment, the insulator 72 is configured by layers of two insulators being the insulating film 70 and the flattening film 80 but may be configured by a layer of one insulator.

The counter anode electrodes 50e as electrodes contain a conductive member, in this example, a metal material. In the embodiment, the counter anode electrodes 50e contain titanium (Ti) and aluminum (Al), and, for example, a titanium layer and an aluminum layer are stacked along the third direction Dz. The counter anode electrodes 50e are provided as pixel electrodes for the respective inorganic light emitting bodies 100 (pixels 49).

The counter cathode electrode 90e is coupled to the cathode wire 60 provided on the array substrate 2 side via a contact hole CH1 provided outside the display region AA. To be specific, the contact hole CH1 is provided in the flattening film 80 and the insulating film 42, and the cathode wire 14 is provided on the bottom surface of the contact hole CH1. The cathode wire 60 is provided above the insulating film 35. That is to say, the cathode wire 60 is provided in the same layer as the source electrodes 41s and the drain electrodes 41d and is formed with the same material. The counter cathode electrode 90e is provided continuously from the display region AA to the peripheral region GA and is coupled to the cathode wire 60 in a bottom portion of the contact hole CH1. The cover portion 92 is provided above the counter cathode electrode 90e. The cover portion 92 is a cover formed by a member transmitting light, for example, glass. The cover portion 92 is not, however, an essential component.

Figure 5:
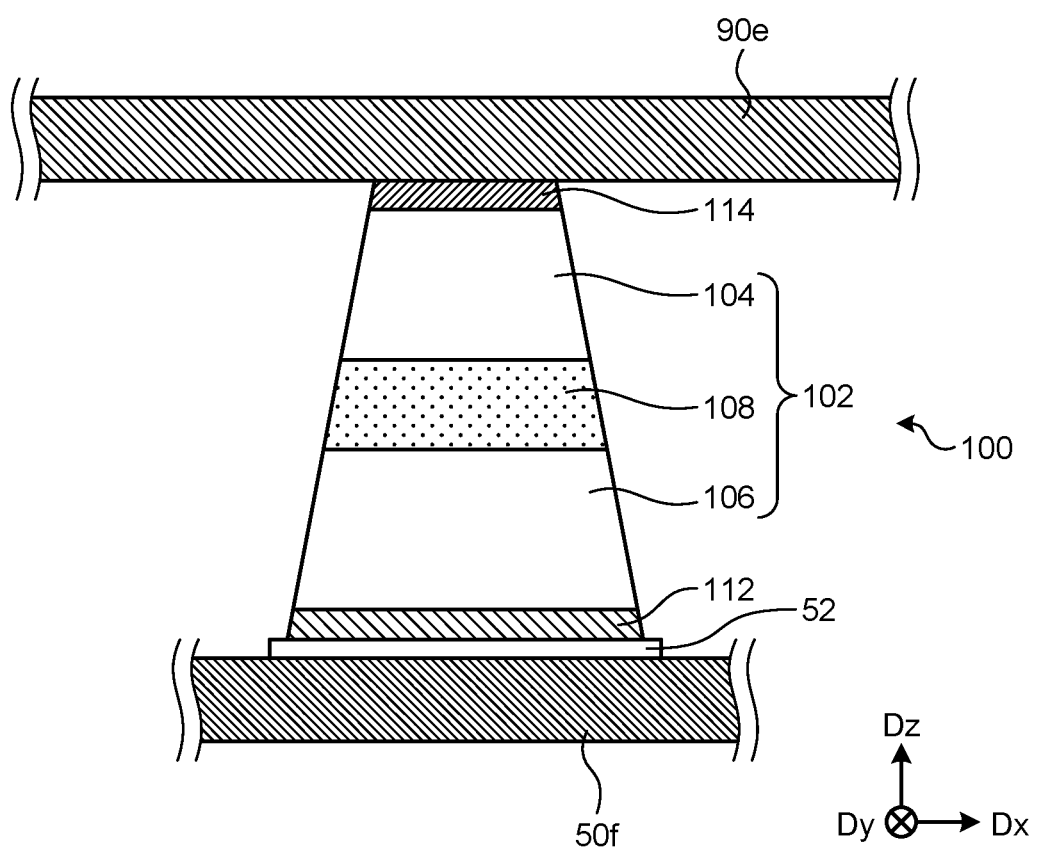
FIG. 5 is a cross-sectional view illustrating an example of the configuration of an inorganic light emitting body in the embodiment.

Next, the configuration of each inorganic light emitting body 100 is described. FIG. 5 is a cross-sectional view illustrating an example of the configuration of the inorganic light emitting body in the embodiment. As illustrated in FIG. 5, the inorganic light emitting body 100 includes an inorganic light emitting element 102, the anode electrode 112, and the cathode electrode 114.

The inorganic light emitting element 102 is a light emitting layer emitting light. The inorganic light emitting element 102 includes an n-type clad layer 104, a p-type clad layer 106, and a light emitting layer 108 provided between the p-type clad layer 106 and the n-type clad layer 104. In the embodiment, the inorganic light emitting element 102 is configured by stacking the p-type clad layer 106, the light emitting layer 108, and the n-type clad layer 104 in this order toward the upward direction. The inorganic light emitting element 102 is formed by a compound semiconductor such as gallium nitride (GaN), aluminum indium gallium phosphide (AlInGaP), aluminum gallium arsenide (AlGaAs), and gallium arsenide phosphide (GaAsP). Furthermore, in the embodiment, the p-type clad layer 106 and the n-type clad layer 104 are made of gallium nitride (GaN) or the like. Indium gallium nitride (InGaN) or the like is used for the light emitting layer 108. The light emitting layer 108 may have a multiple quantum well structure (MQW) in which InGaN and GaN are stacked.

The inorganic light emitting body 100 is configured by stacking the anode electrode 112, the p-type clad layer 106, the light emitting layer 108, the n-type clad layer 104, and the cathode electrode 114 in this order toward the upward direction. The coupling conductive part 52 and the coupling layer 50f that is provided under the coupling conductive part 52 and is coupled to the counter anode electrode 50e are provided under the inorganic light emitting body 100. The counter cathode electrode 90e is provided above the inorganic light emitting body 100.

The coupling layer 50f contains a conductive member, in this example, a metal material. In the embodiment, the coupling layer 50f is made of a material that is the same as that of the counter anode electrode 50e. That is to say, the coupling layer 50f contains, for example, titanium (Ti) and aluminum (Al), and, for example, a titanium layer and an aluminum layer are stacked along the third direction Dz.

The coupling conductive part 52 contains a conductive member, in this example, a metal material. In the embodiment, the coupling conductive part 52 is made of a material having a melting point that is lower than those of the coupling layer 50f and the counter anode electrode 50e. To be specific, the coupling conductive part 52 is formed by solder, conductive pastes, or the like and binds the coupling layer 50f and the anode electrode 112.

The anode electrode 112 is provided above the coupling conductive part 52. The anode electrode 112 is fixed to the coupling conductive part 52. The anode electrode 112 is coupled to the counter anode electrode 50e via the coupling conductive part 52 and the coupling layer 50f. The anode electrode 112 is a conductive member having translucency and is, for example, indium tin oxide (ITO). The anode electrode 112 is electrically coupled to the counter anode electrode 50e. The p-type clad layer 106 is provided above the anode electrode 112. The anode electrode 112 is coupled to the p-type clad layer 106.

The cathode electrode 114 is provided above the n-type clad layer 104. The cathode electrode 114 is a conductive member having translucency and is, for example, ITO. The cathode electrode 114 is coupled to the counter cathode electrode 90e.

The counter cathode electrode 90e as a counter electrode is a conductive member having translucency and is, for example ITO. The counter cathode electrode 90e is a common electrode that is provided to be common to (in this example, all) the inorganic light emitting bodies 100 (pixels 49) and is coupled to the cathode electrodes 114 of (in this example, all) the inorganic light emitting bodies 100.

Repair of Display Device

The display device 1 configured as described above displays an image by light emission of the inorganic light emitting bodies 100. It is difficult to manufacture the display device 1 including the inorganic light emitting bodies 100 due to difficulty in mounting the inorganic light emitting bodies 100 because the size of the inorganic light emitting bodies 100 is small, for example, and defects tend to be generated. When the display device 1 having the defect is not used and is discarded and so on, a yield is lowered. By contrast, in the embodiment, the defective display device 1 is repaired to make the defective display device 1 into a usable state, thereby preventing the yield from being lowered. The defect indicates that at least some inorganic light emitting bodies 100 mounted on the display device 1 do not emit light properly. Examples of the state where the inorganic light emitting body 100 does not emit light properly include a dark spot state and a bright spot state. The dark spot state indicates a state where the inorganic light emitting body 100 does not emit light even in the case in which a current for causing the inorganic light emitting body 100 to emit light flows therethrough. In the embodiment, the case in which the current for causing the inorganic light emitting body 100 to emit light flows therethrough indicates the case in which a current in accordance with display gradation is supplied to the inorganic light emitting body 100 via the drive transistor DRT from the anode power supply line L1 in the light emission operation period. In this case, normally, the current in accordance with the display gradation is supplied to the anode electrode 112 of the inorganic light emitting body 100 via the drain coupling wire 43d and the counter anode electrode 50e from the drive transistor DRT, and the inorganic light emitting body 100 emits light with the current. In the dark spot state, the inorganic light emitting body 100 does not emit light even when the current is supplied to the inorganic light emitting body 100 via the drive transistor DRT from the anode power supply line L1. On the other hand, the bright spot state indicates a state where the inorganic light emitting body 100 emits light even in the case in which no current for causing the inorganic light emitting body 100 to emit light flows therethrough. That is to say, the bright spot state is a state where the inorganic light emitting body emits light even when no current for causing the inorganic light emitting body 100 to emit light flows therethrough, that is, even when the drive transistor DRT coupled to the inorganic light emitting body 100 needs to be in the OFF state in principle.

Conceivable defective modes in the dark spot state include disconnection between the anode power supply line L1 and the inorganic light emitting body 100, a defect in conduction characteristics of the transistor, a mounting defect due to a formation defect of the coupling conductive part 52 or the counter cathode electrode 90e, and a defect in characteristics of the inorganic light emitting body 100 itself. Among them, although the former two modes occur due to a problem in the substrate and a regular state cannot therefore be recovered by repairing, in the other modes, the regular state can be recovered by repairing.

Conceivable defective modes in the bright spot state include power source short circuit due to foreign matters or the like between the anode power supply line L1 and the inorganic light emitting body 100 and a defect in switching characteristics of the transistor. That is to say, although the bright spot state is caused by the problem in the substrate and the regular state cannot therefore be recovered by repairing, the bright spot can be darkened by removing the inorganic light emitting body 100 as a defective portion. Although the dark spot is a defect, darkening of the bright spot defect is effective because the dark spot defect has a higher tolerance than the bright spot defect in terms of device quality.

Figure 6:
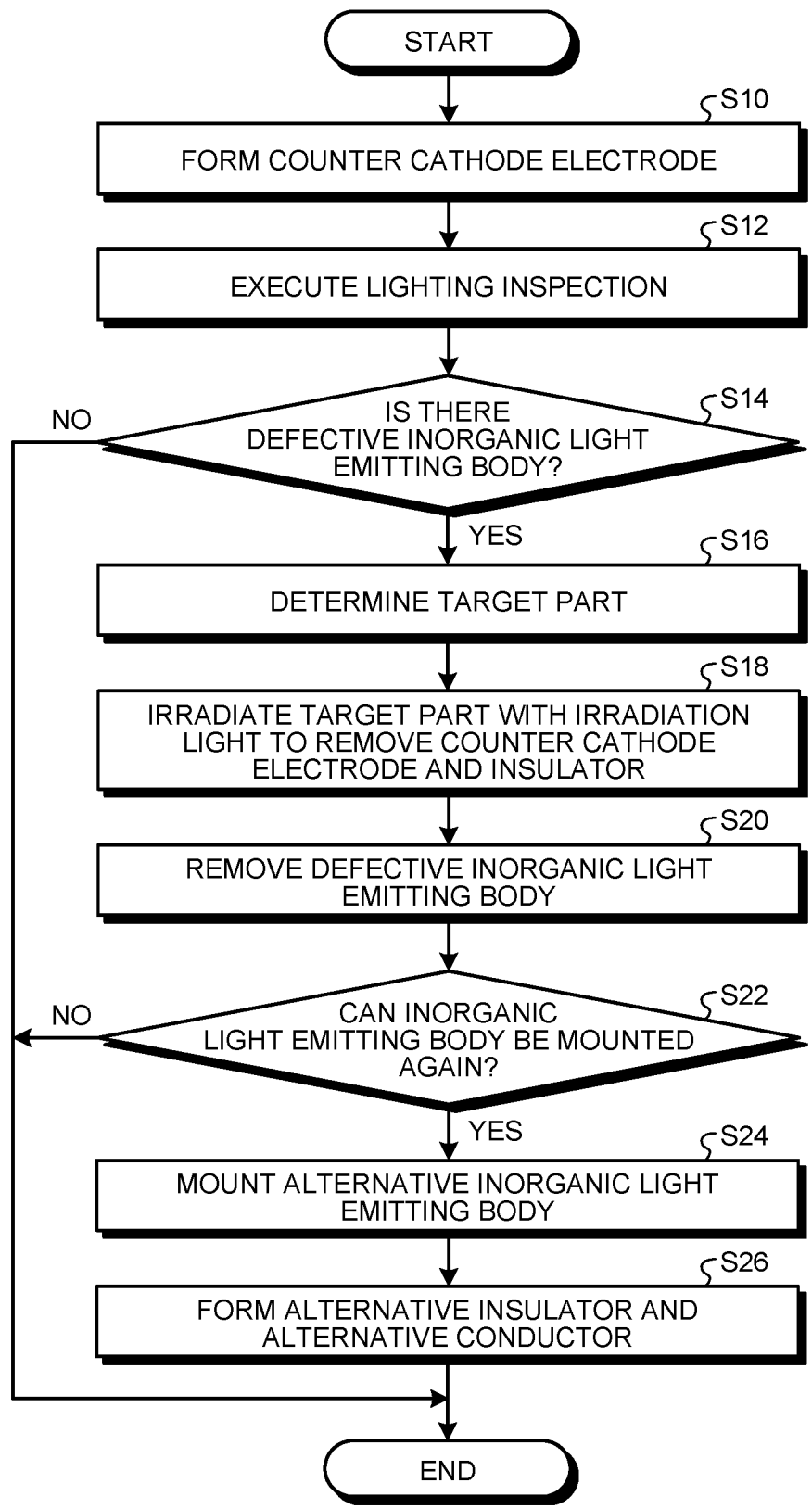
FIG. 6 is a flowchart for explaining a method for repairing the display device in the embodiment.

FIG. 6 is a flowchart for explaining a method for repairing the display device in the embodiment. As illustrated in FIG. 6, in a method for repairing the display device 1 in the embodiment, the counter cathode electrode 90e is formed above the array substrate 2 (step S10), and then, a lighting inspection is executed (step S12) to detect a defective inorganic light emitting body 100A as the inorganic light emitting body 100 having a defect from the inorganic light emitting bodies 100 mounted on the display device 1 (step S14; detection step). To be specific, for example, the counter anode electrodes 50e, the inorganic light emitting bodies 100, and the counter cathode electrode 90e are stacked above the array substrate 2 to form the display device 1. In other words, components under the counter cathode electrode 90e and the counter cathode electrode 90e in the display device 1 are formed. The defective inorganic light emitting body 100A is detected by performing the lighting inspection on the display device 1. In the embodiment, the defective inorganic light emitting body 100A is the inorganic light emitting body 100 in the bright spot state or the dark spot state. In the lighting inspection, for example, a current for causing all the inorganic light emitting bodies 100 to emit light flows through the inorganic light emitting bodies 100 to detect the inorganic light emitting body 100 that does not emit light as the defective inorganic light emitting body 100A in the dark spot state. Furthermore, among the inorganic light emitting bodies 100, the inorganic light emitting body 100 that emits light even when no current for causing the inorganic light emitting bodies 100 to emit light flows therethrough is detected as the defective inorganic light emitting body 100A in the bright spot state. It should be noted that the method for detecting the defective inorganic light emitting body 100A is not limited to the lighting inspection.

When the detective inorganic light emitting body 100A is detected (Yes at step S14), a target part AR1 is determined (step S16). The target part AR1 is irradiated with irradiation light LI to remove the counter cathode electrode 90e and the insulator 72 (in the embodiment, the insulating film 70 and the flattening film 80) included in the target part AR1 (step S18: insulator removal step). Hereinafter, this step is specifically described.

Figure 7A:
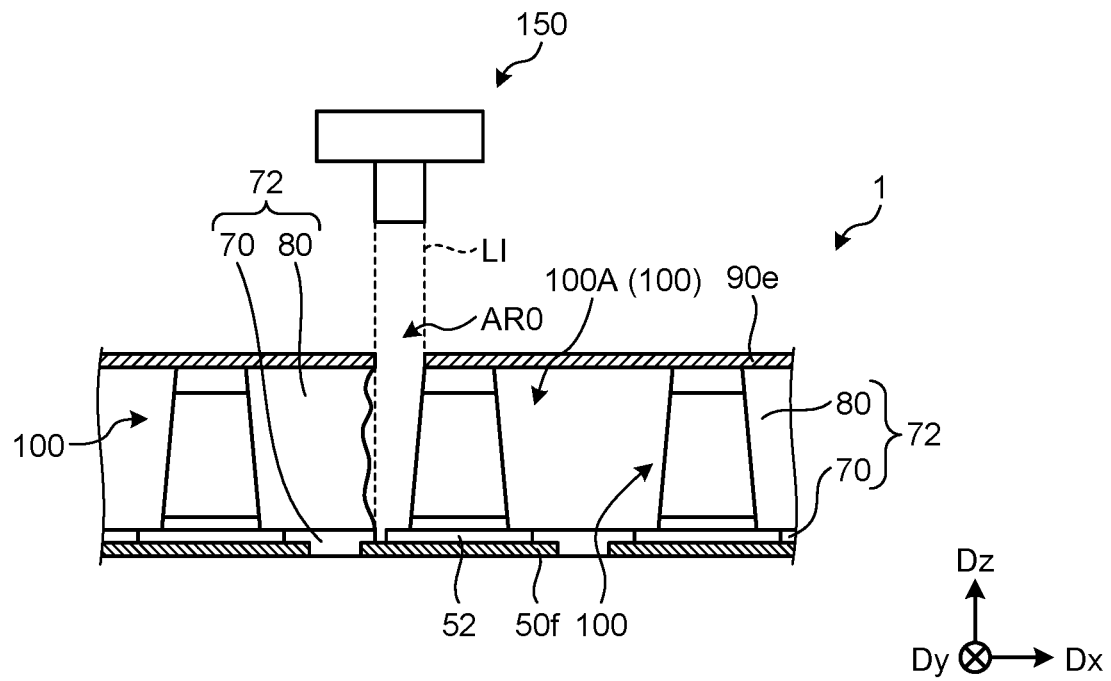
FIGS. 7A and 7B are schematic views illustrating an example when a target part is irradiated with irradiation light.
Figure 7B:
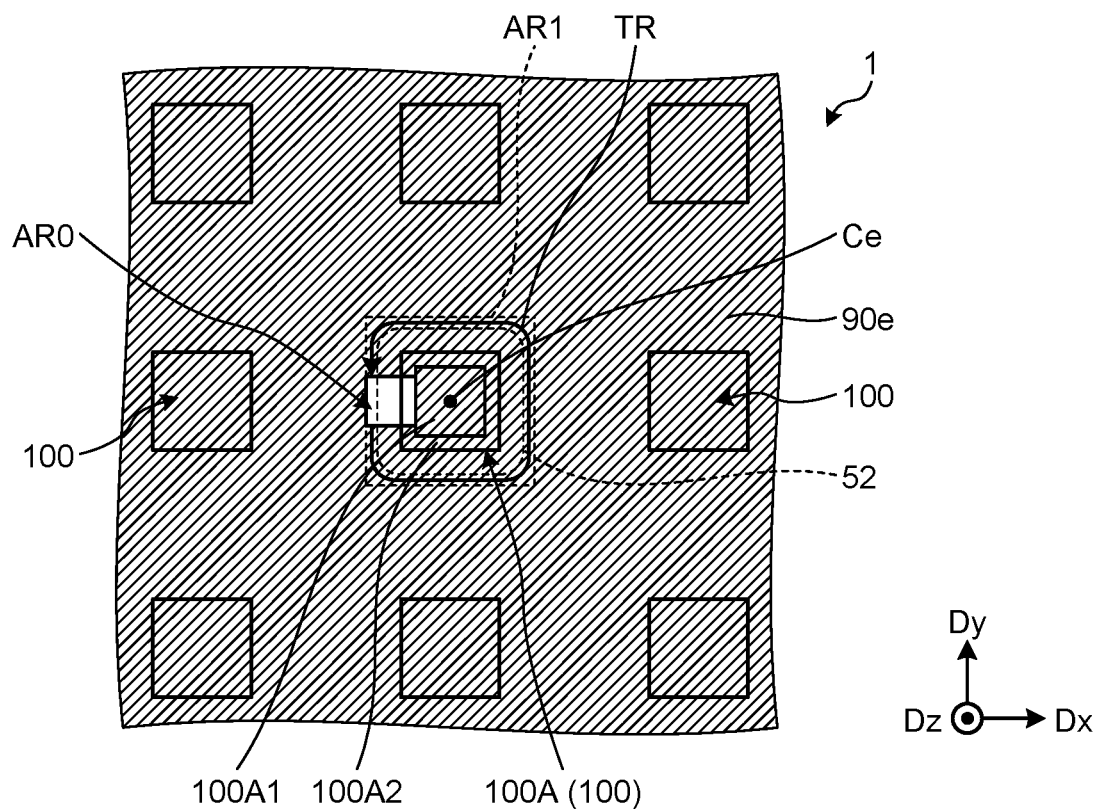
Figure 8A:
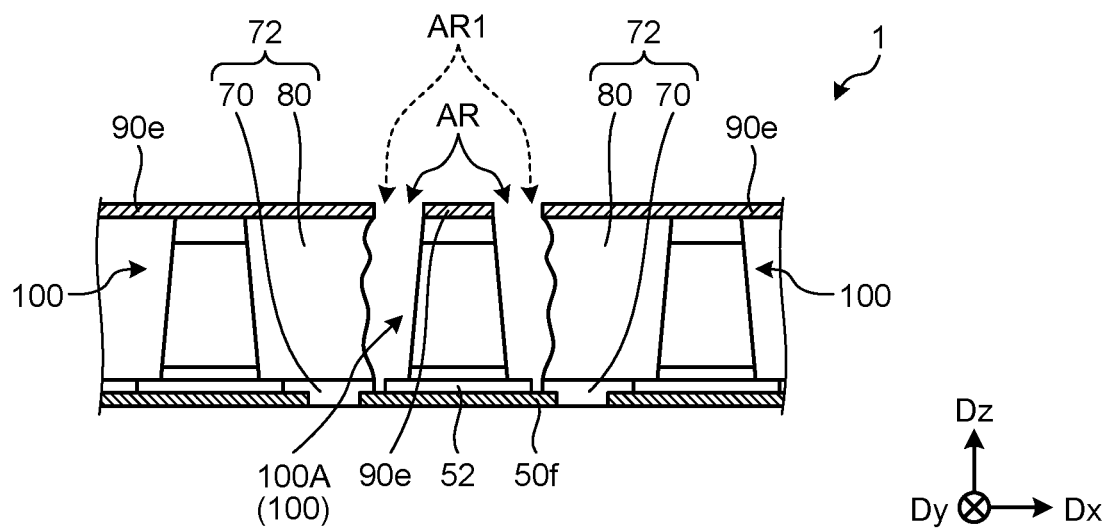
FIGS. 8A and 8B are schematic views illustrating the example when the target part is irradiated with the irradiation light.
Figure 8B:
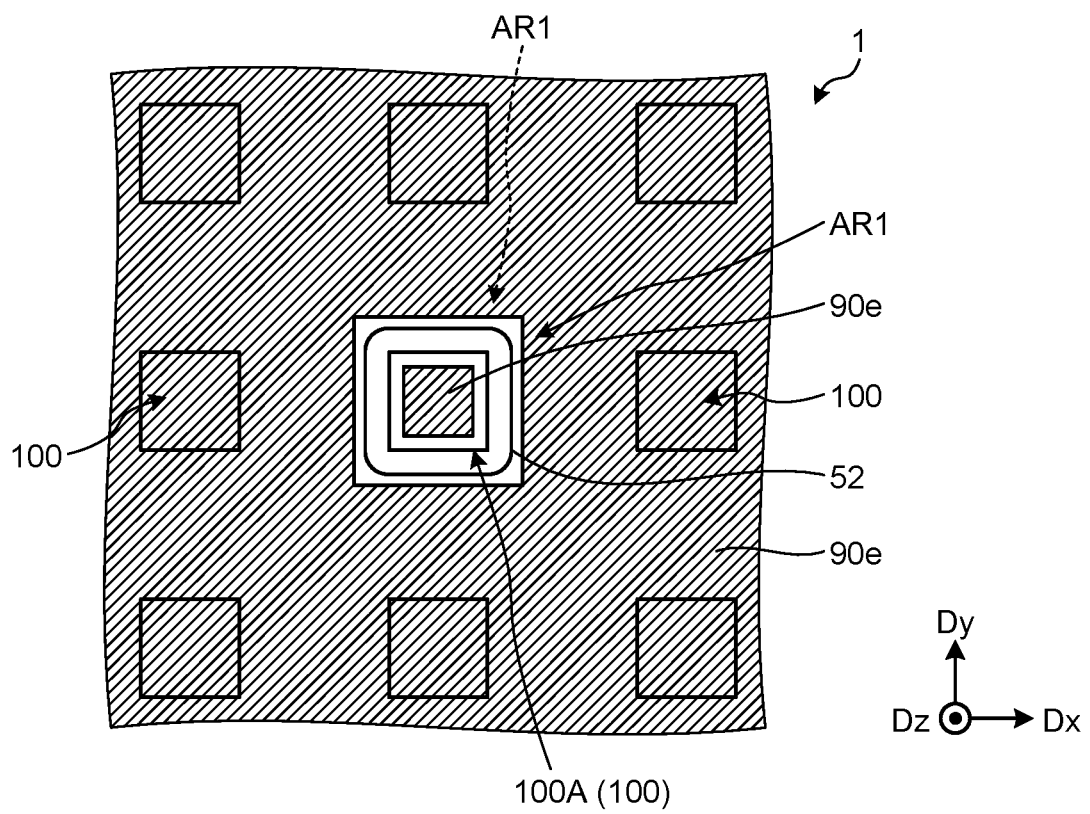

FIGS. 7A and 7B and FIGS. 8A and 8B are schematic views illustrating an example when the target part is irradiated with the irradiation light. FIG. 7A is a view schematically illustrating the cross section of the display device 1 when the target part AR1 is irradiated with the irradiation light LI, and FIG. 7B is a view schematically illustrating the upper surface of the display device 1 when the target part AR1 is irradiated with the irradiation light. Also in each of FIG. 8A to FIG. 14B subsequent thereto, A is a cross-sectional view and B is a top view. FIGS. 8A and 8B are views schematically illustrating the display device 1 after the target part AR1 is removed.

In the repairing method in the embodiment, after the defective inorganic light emitting body 100A is detected, the target part AR1 is determined on the basis of a position of the detected defective inorganic light emitting body 100A. The target part AR1 is a part of the insulator 72 and the counter cathode electrode 90e that are to be removed. That is to say, in the repairing method in the embodiment, parts of the insulator 72 and the counter cathode electrode 90e that are to be removed are determined on the basis of the position of the defective inorganic light emitting body 100A. As illustrated in FIG. 7B, the target part AR1 includes a part around the defective inorganic light emitting body 100A when seen from the traveling direction of the light emitted from the inorganic light emitting bodies 100, that is, when seen from the third direction Dz side (in plan view). In other words, the target part AR1 is a part surrounding the defective inorganic light emitting body 100A when seen from the third direction Dz side. To be more specific, the target part AR1 is preferably a part located on the outer side of a center part 100A1 of the defective inorganic light emitting body 100A in the radiation direction and surrounding the center part 100A1 when seen from the third direction Dz side. The outer side in the radiation direction indicates the direction away from a center Ce when seen from the third direction Dz, the center Ce being the center of the defective inorganic light emitting body 100A when seen from the third direction Dz. The center part 100A1 is a part at the center of the defective inorganic light emitting body 100A when seen from the third direction Dz. The center part 100A1 is a part on the center side about the center Ce when seen from the third direction Dz. When seen from the third direction Dz, the center part 100A1 may have an area of, for example, 50% to 90% relative to the entire area of the defective inorganic light emitting body 100A. A part of the defective inorganic light emitting body 100A on the outer side of the center part 100A1 in the radiation direction is set to an outer edge part 100A2. The outer edge part 100A2 is a part located on the outer side of the center part 100A1 in the radiation direction and surrounding the center part 100A1 when seen from the third direction Dz. In this case, it can be said that the target part AR1 preferably includes a part overlapping with the outer edge part 100A2 of the defective inorganic light emitting body 100A and a part on the outer side of the outer edge part 100A2 in the radiation direction when seen from the third direction Dz. When multiple defective inorganic light emitting bodies 100A are detected, the target part AR1 is determined for each of the defective inorganic light emitting bodies 100A.

In the example of FIGS. 7A and 7B, the center part 100A1 is identical to an upper surface (cathode electrode 114) in the defective inorganic light emitting body 100A the area of which is decreased upward. The center part 100A1 is, however, not limited thereto and may be, for example, a part narrower than the upper surface. In other words, in the example of FIGS. 7A and 7B, the inner circumference of the target part AR1 is along the outer circumference of the upper surface of the defective inorganic light emitting body 100A. The inner circumference of the target part AR1 may, however, be located on the inner side of the outer circumference of the upper surface of the defective inorganic light emitting body 100A in the radiation direction. The target part AR1 is not limited to overlapping with the outer edge part 100A2 of the defective inorganic light emitting body 100A when seen from the third direction Dz and may be located on the outer side of the outer edge part 100A2 in the radiation direction and surround the outer edge part 100A2.

After the position of the target part AR1 is determined, in the embodiment, as illustrated in FIG. 7A, a light irradiation device 150 emits the irradiation light LI to the target part AR1. The irradiation light LI is laser light in the embodiment. The irradiation light LI is light having such wavelength that it can remove the insulator 72 and the counter cathode electrode 90e when hitting the insulator 72 and the counter cathode electrode 90e whereas it does not remove the inorganic light emitting bodies 100 when hitting the inorganic light emitting bodies 100. To be specific, the wavelength of the irradiation light LI is preferably 216 nm to 316 nm, and more preferably 240 nm to 282 nm.

A region where the display device 1 is irradiated with the irradiation light LI in a state where an irradiation position as a position at which the display device 1 is irradiated with the irradiation light LI is fixed is an irradiation region AR0. In this case, as illustrated in FIG. 7B, the area of the irradiation region AR0 is set to be smaller than the area of the target part AR1 when seen from the third direction Dz. With this setting, in this repairing method, the light irradiation device 150 does not emit the irradiation light LI to the entire target part AR1 (by one shot) in a state where the irradiation position is fixed but emits the irradiation light LI to the entire target part AR1 while moving (scanning) the irradiation region AR0 (irradiation position). That is to say, the light irradiation device 150 sets the irradiation position such that the irradiation region AR0 is located within a range of the target range AR1 when seen from the third direction Dz and moves the irradiation region AR0 (irradiation position) along a trajectory TR in a state of emitting the irradiation light LI to thereby irradiate the entire target part AR1 with the irradiation light LI. In the example of FIG. 7B, the trajectory TR is a path along the circumference of the center part 100A1 of the defective inorganic light emitting body 100A. That is to say, the light irradiation device 150 moves the irradiation region AR0 (irradiation position) along the outer circumference of the center part 100A1. More specifically, the light irradiation device 150 moves the irradiation region AR0 (irradiation position) for one round along the outer circumference of the center part 100A1 to thereby irradiate the entire target part AR1 with the irradiation light LI. The trajectory TR of the irradiation region AR0 (irradiation position) is not limited thereto and may be a desired path, for example, a path for a plurality of rounds along the outer circumference of the center part 100A1.

The target part AR1, that is, the insulator 72 and the counter cathode electrode 90e included in the target part AR1 are removed by being irradiated with the irradiation light LI. In other words, in this repairing method, the insulator 72 and the counter cathode electrode 90e around the defective inorganic light emitting body 100A are removed by irradiating the insulator 72 and the counter cathode electrode 90e around the defective inorganic light emitting body 100A with the irradiation light LI. As illustrated in FIGS. 8A and 8B, a space AR is thereby formed at a place where the target part AR1 has been removed. That is to say, the space AR is a space formed by removal of the insulator 72 and the counter cathode electrode 90e included in the target part AR1. As illustrated in FIG. 8A, side surfaces of the defective inorganic light emitting body 100A are exposed to the space AR by removal of the target part AR1. In the embodiment, the target part AR1 overlaps with the outer edge part 100A2 of the defective inorganic light emitting body 100A when seen from the third direction Dz. The defective inorganic light emitting body 100A is therefore also irradiated with the irradiation light LI but is not removed by the irradiation light LI and remains in the display device 1, that is, on the array substrate 2. More specifically, the coupling conductive part 52 bonded to at least the center part 100A1 is not molten and is kept being bonded to the defective inorganic light emitting body 100A because the center part 100A1 of the defective inorganic light emitting body 100A is not irradiated with the irradiation light LI. The defective inorganic light emitting body 100A can be kept being fixed to the coupling conductive part 52 and be made to remain above the array substrate 2 even when irradiated with the irradiation light LI. Although in the example of FIGS. 8A and 8B, the counter cathode electrode 90e remains above the defective inorganic light emitting body 100A, the counter cathode electrode 90e above the defective inorganic light emitting body 100A may also be removed. Although in the example of FIGS. 8A and 8B, the target part AR1 is removed, and the side surfaces of the defective inorganic light emitting body 100A are thereby exposed, the insulator 72 may remain on the side surfaces of the defective inorganic light emitting body 100A. In this case, it is preferable that the insulator 72 remaining on the side surfaces of the defective inorganic light emitting body 100A be not coupled to the insulator 72 therearound.

Figure 9A:
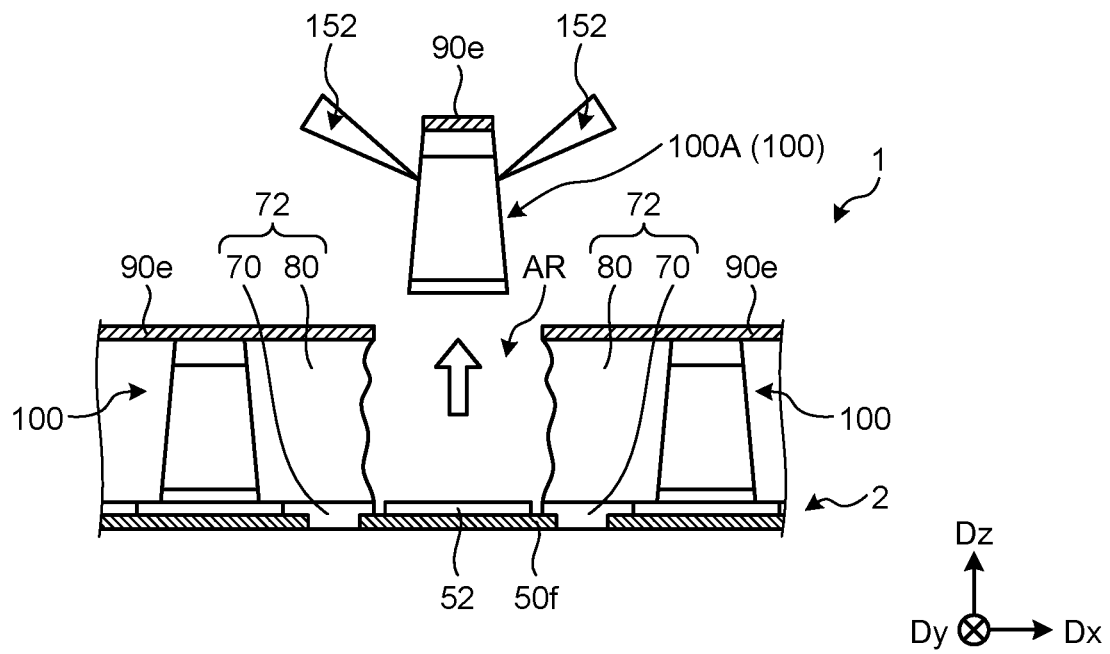
FIGS. 9A and 9B are schematic views for explaining a process of removing a defective inorganic light emitting body.
Figure 9B:
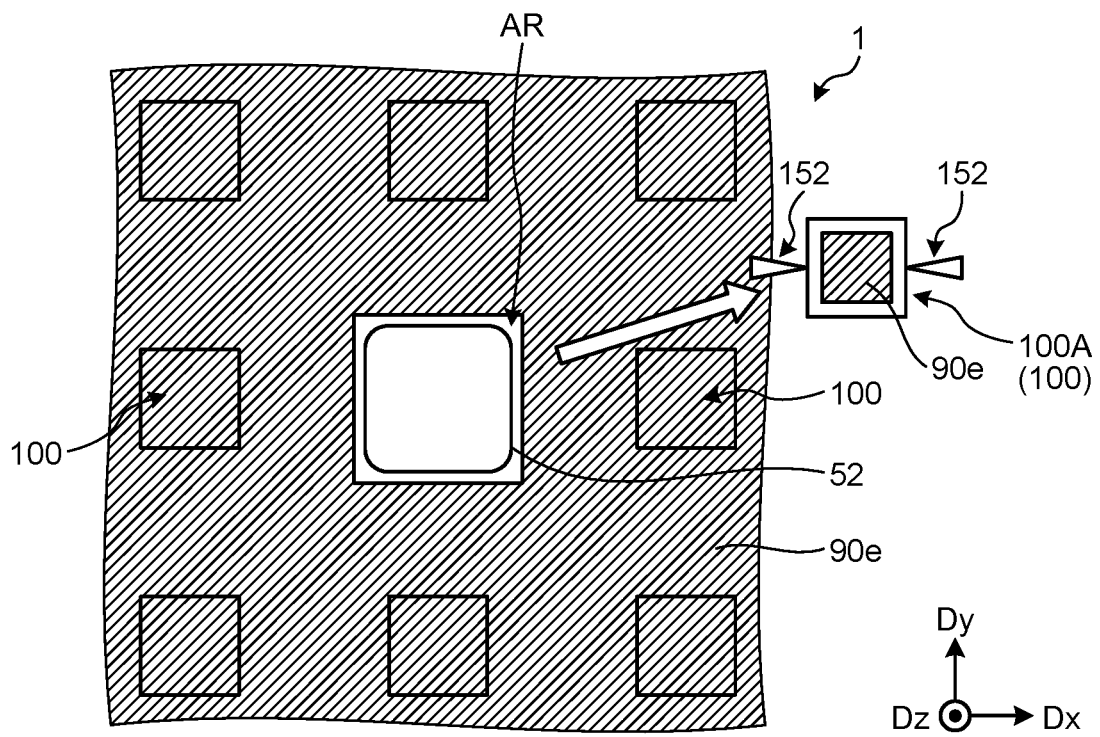
Figure 10A:
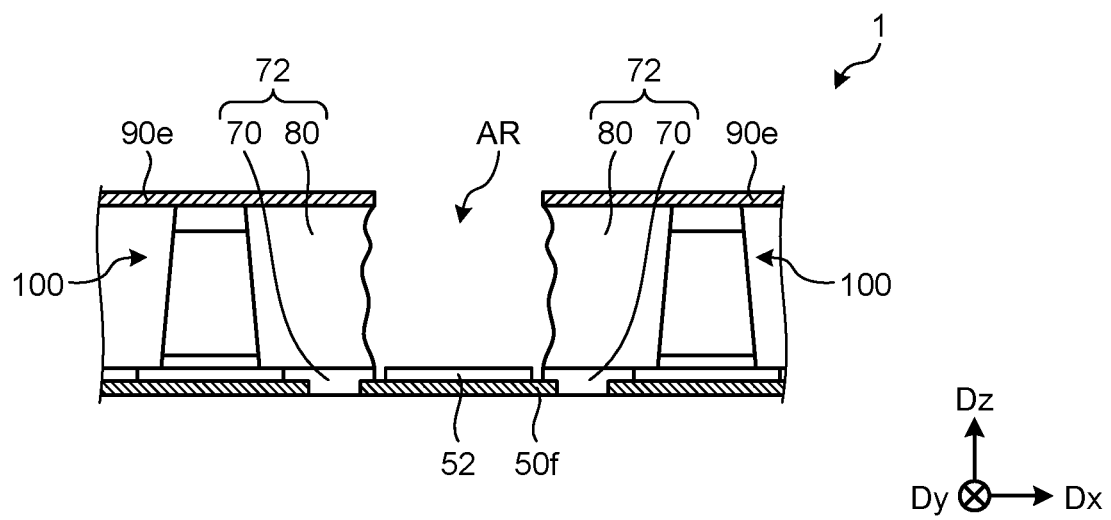
FIGS. 10A and 10B are views schematically illustrating the display device after the defective inorganic light emitting body is removed.
Figure 10B:
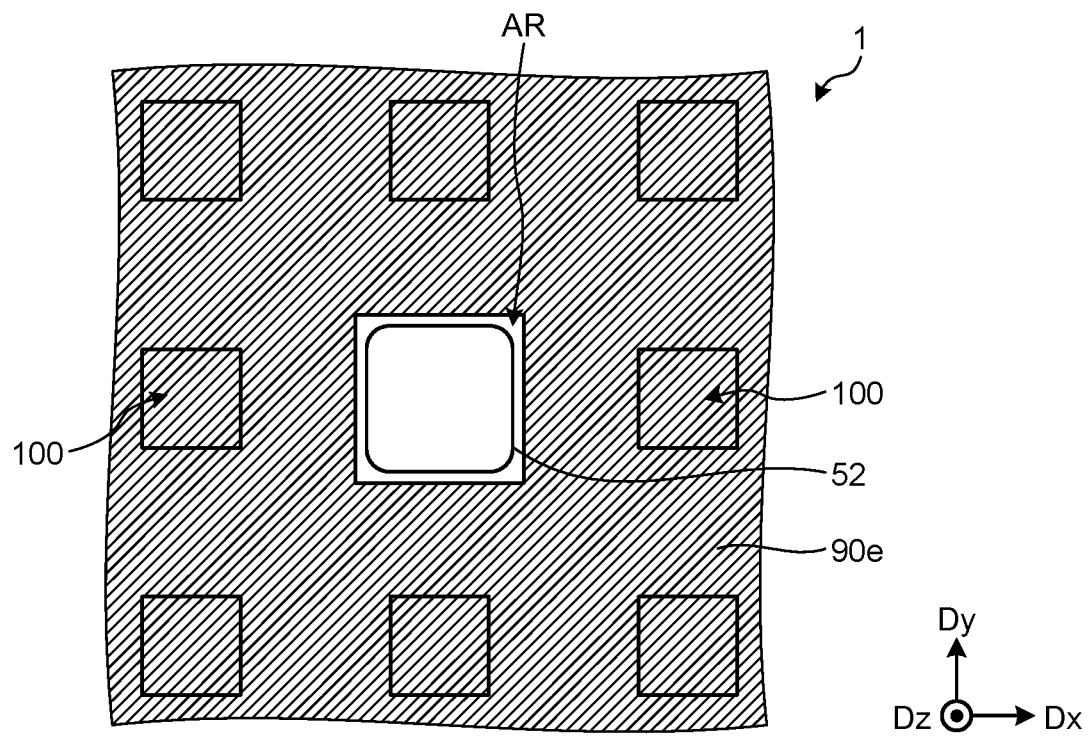

After the insulator 72 and the counter cathode electrode 90e included in the target part AR1 are thus removed by irradiation with the irradiation light LI, the defective inorganic light emitting body 100A remaining above the array substrate 2 is removed from the array substrate 2, that is, from the display device 1, as illustrated in FIG. 6 (step S20; inorganic light emitting body removal step). FIGS. 9A and 9B are schematic views for explaining a process of removing the defective inorganic light emitting body and FIGS. 10A and 10B are views schematically illustrating the display device after the defective inorganic light emitting body is removed. As illustrated in FIGS. 9A and 9B, in this repairing method, the defective inorganic light emitting body 100A is removed from the display device 1 using, for example, a tool (pickup tool) 152. The tool 152 is a tool for gripping the defective inorganic light emitting body 100A, for example. In this example, the defective inorganic light emitting body 100A is detached from the display device 1 by putting the tool 152 into the space AR, gripping the side surfaces of the defective inorganic light emitting body 100A with the tool 152, and pulling the tool 152 up. Although the defective inorganic light emitting body 100A is fixed to the coupling conductive part 52, it is detached from the coupling conductive part 52 by being pulled with the tool 152 (fixing is canceled). That is to say, the defective inorganic light emitting body 100A is pulled with the tool 152 in a state where pulling force with the tool 152 is set to be larger than binding force between the defective inorganic light emitting body 100A and the coupling conductive part 52, so that the defective inorganic light emitting body 100A can be detached while reducing damage on the coupling conductive part 52, the coupling layer 50f, and the like. When the defective inorganic light emitting body 100A is thus removed from the display device 1, as illustrated in FIG. 10A, the coupling conductive part 52, the coupling layer 50f, and the counter cathode electrode 90e (not illustrated) that have been coupled to the defective inorganic light emitting body 100A remain in the display device 1, that is, above the array substrate 2. The space AR of the display device 1 includes the space formed by removal of the insulator 72 and the counter cathode electrode 90e with the irradiation light LI and the space formed by removal of the defective inorganic light emitting body 100A with the tool 152. The configuration of the tool 152 illustrated in FIGS. 9A and 9B is merely an example, and a desired configuration may be employed. The tool 152 may be configured to hold the defective inorganic light emitting body 100A after the insulator 72 therearound is removed and be detachable from the display device 1.

After the defective inorganic light emitting body 100A is removed, whether the inorganic light emitting body 100 can be mounted again at a place from which the defective inorganic light emitting body 100A has been removed is determined, as illustrated in FIG. 6 (step S22). When the defective inorganic light emitting body 100A itself has a defect and the coupling conductive part 52, the coupling layer 50f, and the counter cathode electrode 90e under the defective inorganic light emitting body 100A have no defect, for example, it is determined that the inorganic light emitting body 100 can be mounted again. Also when the defective inorganic light emitting body 100A itself has no defect and there is a defect in coupling between the defective inorganic light emitting body 100A and the counter cathode electrode 90e, for example, it is determined that the inorganic light emitting body 100 can be mounted again. On the other hand, when the coupling conductive part 52, the coupling layer 50f, the counter cathode electrode 90e, or the like under the defective inorganic light emitting body 100A has a defect, for example, it is determined that the inorganic light emitting body 100 cannot be mounted again because the defect is not eliminated even by replacement of the inorganic light emitting body 100.

When it is determined that the inorganic light emitting body 100 can be mounted again (Yes at step S22), an alternative inorganic light emitting body 100B is mounted in the space formed by the removal of the defective inorganic light emitting body 100A in the space AR, that is, in the space where the defective inorganic light emitting body 100A was mounted (step S24). The alternative inorganic light emitting body 100B is the inorganic light emitting body 100 that emits light of the same color as that of the emitted light when the defective inorganic light emitting body 100A is normal, for example. Although the alternative inorganic light emitting body 100B is the inorganic light emitting body 100 differing from the defective inorganic light emitting body 100A, when the defective inorganic light emitting body 100A itself has no defect (a cause of the defect is a formation defect of the coupling conductive part or the counter cathode electrode and so on), the defective inorganic light emitting body 100A may be mounted again as the alternative inorganic light emitting body 100B.

Figure 11A:
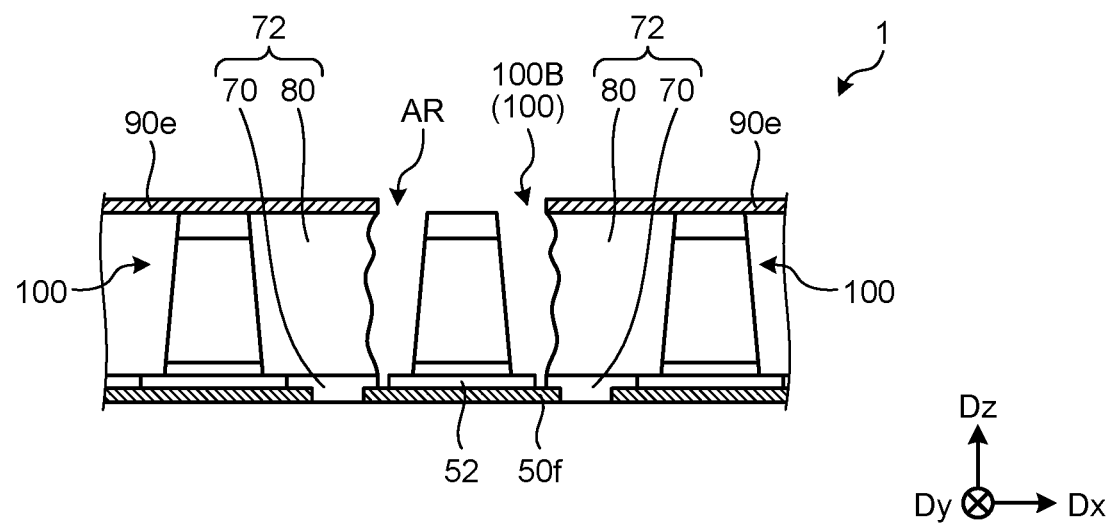
FIGS. 11A and 11B are views for schematically explaining a process of mounting an alternative inorganic light emitting body.
Figure 11B:
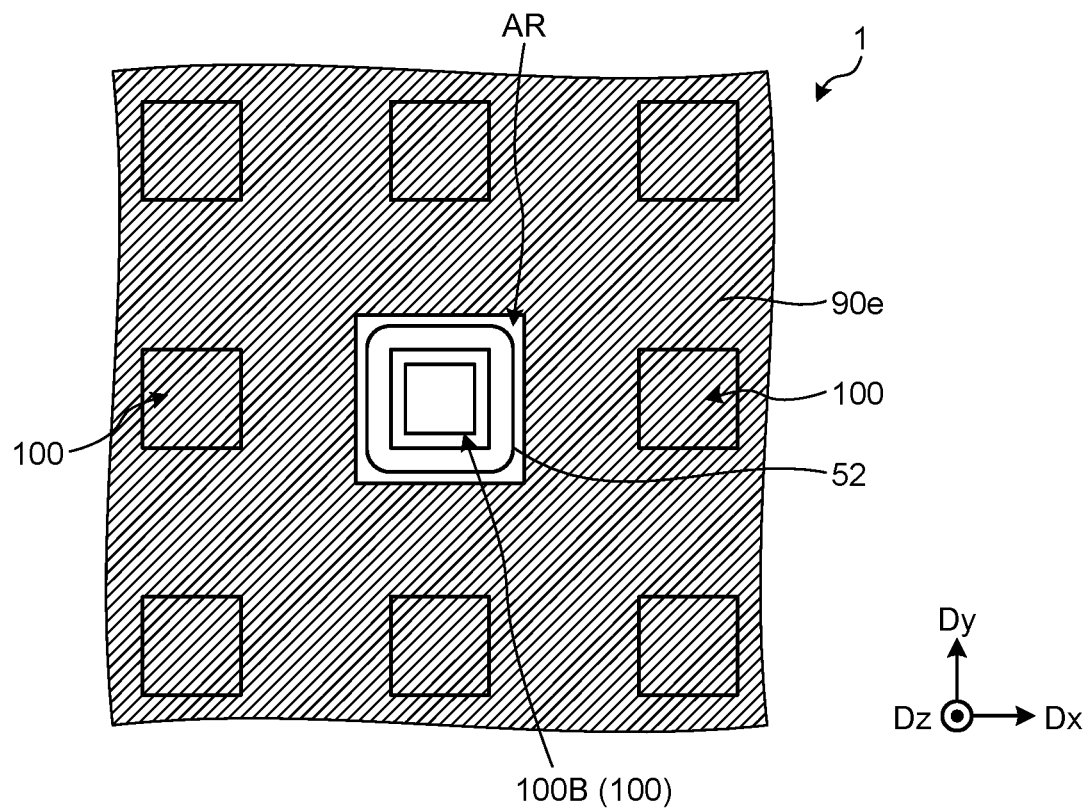
Figure 12A:
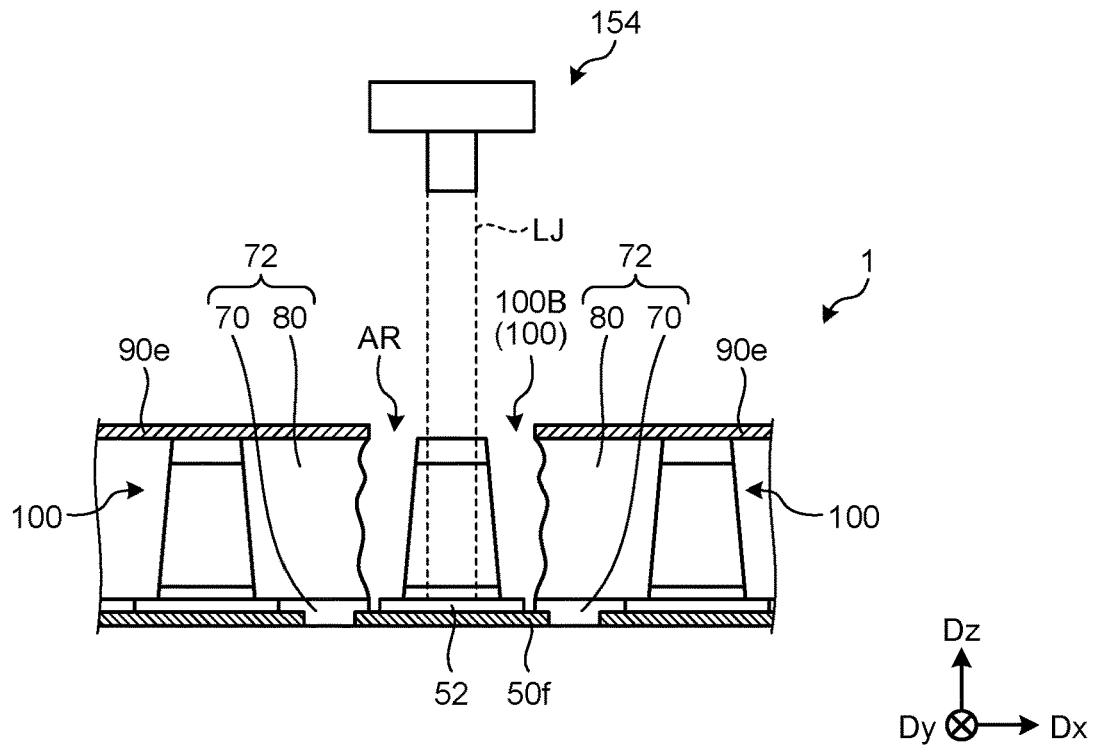
FIGS. 12A and 12B are views for schematically explaining the process of mounting the alternative inorganic light emitting body.
Figure 12B:
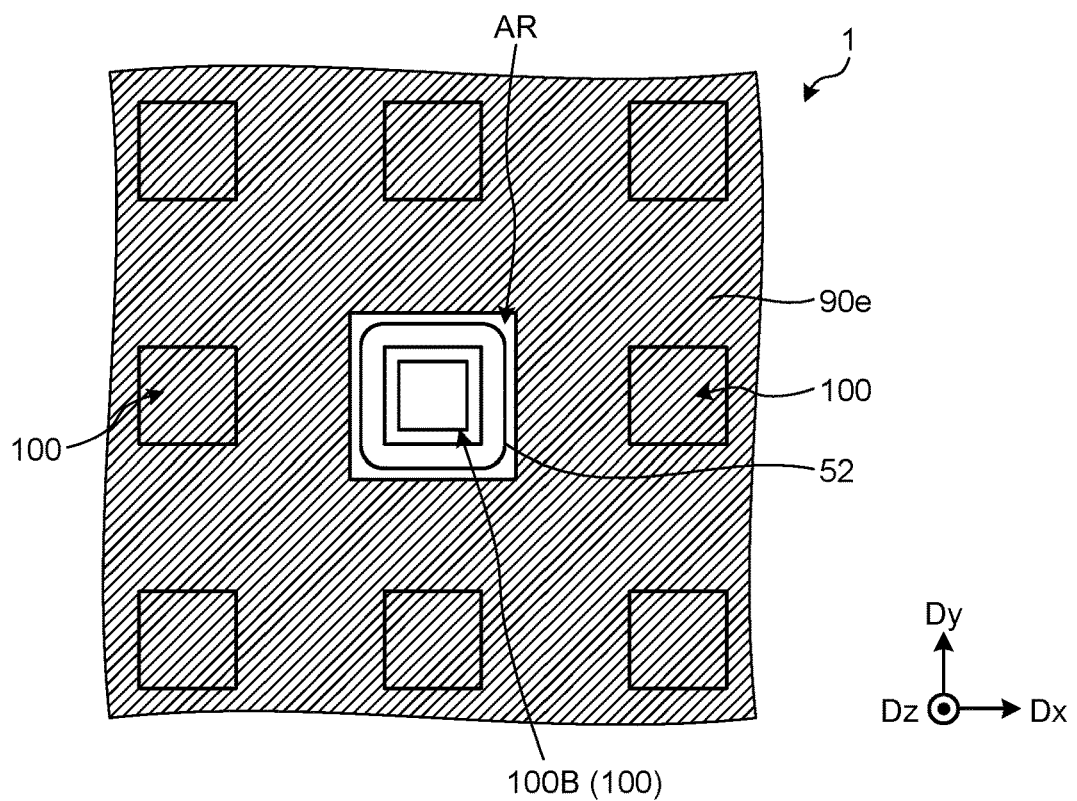

A method for mounting the alternative inorganic light emitting body 100B is described in detail. FIG. 11A to FIG. 12B are views for schematically explaining a process of mounting the alternative inorganic light emitting body. As illustrated in FIGS. 11A and 11B, in this repairing method, the alternative inorganic light emitting body 100B is disposed in the space formed after the removal of the defective inorganic light emitting body 100A in the space AR, more specifically, above the coupling conductive part 52 to which the defective inorganic light emitting body 100A has been bonded. Then, as illustrated in FIG. 12A, a light irradiation device 154 emits irradiation light LJ toward the coupling conductive part 52 on which the alternative inorganic light emitting body 100B is installed on the upper surface. The irradiation light LJ is laser light in the embodiment. The irradiation light LJ is light having such wavelength that it does not remove the inorganic light emitting body 100 even when hitting the inorganic light emitting body 100. To be specific, the wavelength of the irradiation light LJ is preferably larger than the wavelength of the irradiation light LI. The irradiation light LJ is preferably, for example, infrared light of equal to or more than 800 nm, and more preferably 1014 nm to 1114 nm. In the example of FIGS. 12A and 12B, the alternative inorganic light emitting body 100B is irradiated with the irradiation light LJ from the upper side of the alternative inorganic light emitting body 100B disposed above the coupling conductive part 52. Also in this case, the coupling conductive part 52 is located under the alternative inorganic light emitting body 100B, and it can therefore be said that the irradiation light LJ is emitted toward the coupling conductive part 52. The alternative inorganic light emitting body 100B is heated by being irradiated with the irradiation light LJ, and heat of the alternative inorganic light emitting body 100B is transferred to the coupling conductive part 52. The coupling conductive part 52 is heated with the heat transferred from the alternative inorganic light emitting body 100B to be molten. After that, the irradiation of the irradiation light LJ is stopped, heating of the coupling conductive part 52 is thereby stopped, and then, the coupling conductive part 52 is cooled and hardened by natural cooling or forced cooling, for example. When the coupling conductive part 52 is molten, and then hardened, the alternative inorganic light emitting body 100B is fixed (bonded) to the coupling conductive part 52. The alternative inorganic light emitting body 100B is thereby fixed to the coupling layer 50f with the coupling conductive part 52 interposed therebetween. In other words, the alternative inorganic light emitting body 100B is fixed to the counter anode electrode 50e with the coupling conductive part 52 and the coupling layer 50f interposed therebetween. It can also be said that the alternative inorganic light emitting body 100B is electrically coupled to the counter anode electrode 50e via the coupling conductive part 52 and the coupling layer 50f In the example of the embodiment, heat of the alternative inorganic light emitting body 100B irradiated with the irradiation light LJ is transferred to the coupling conductive part 52 to thereby heat the coupling conductive part 52. A heating method of the coupling conductive part 52 is not, however, limited thereto. For example, the coupling conductive part 52 may be heated by being directly irradiated with the irradiation light LJ. Alternatively, the coupling conductive part 52 may be heated by irradiating the alternative inorganic light emitting body 100B with the irradiation light LJ passing through the alternative inorganic light emitting body 100B and causing the irradiation light LJ that has passed through the alternative inorganic light emitting body 100B to reach the coupling conductive part 52.

Figure 13A:
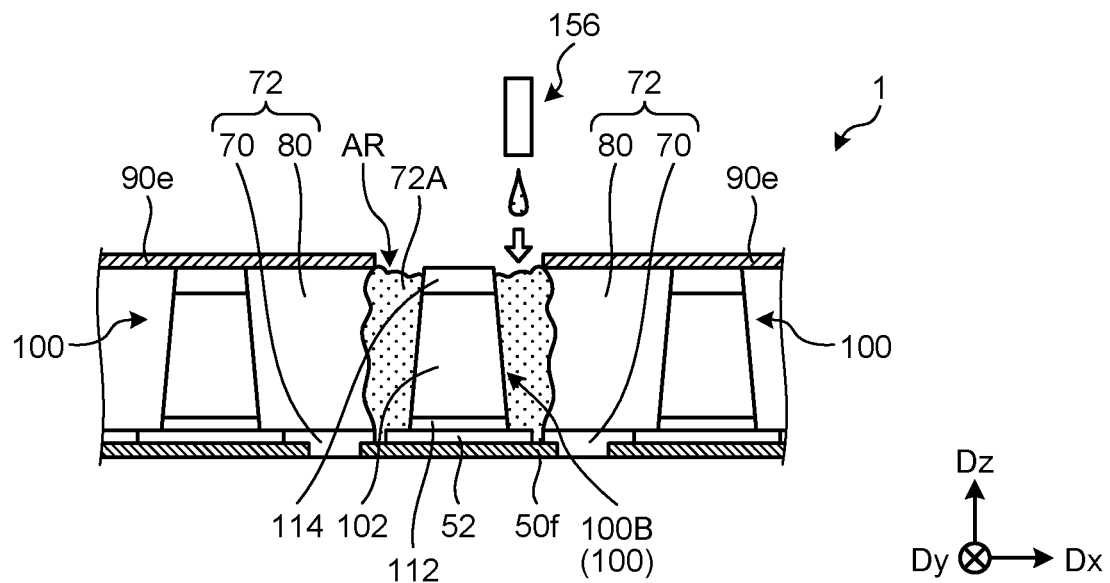
FIGS. 13A and 13B are views for schematically explaining a process of forming an alternative insulator.
Figure 13B:
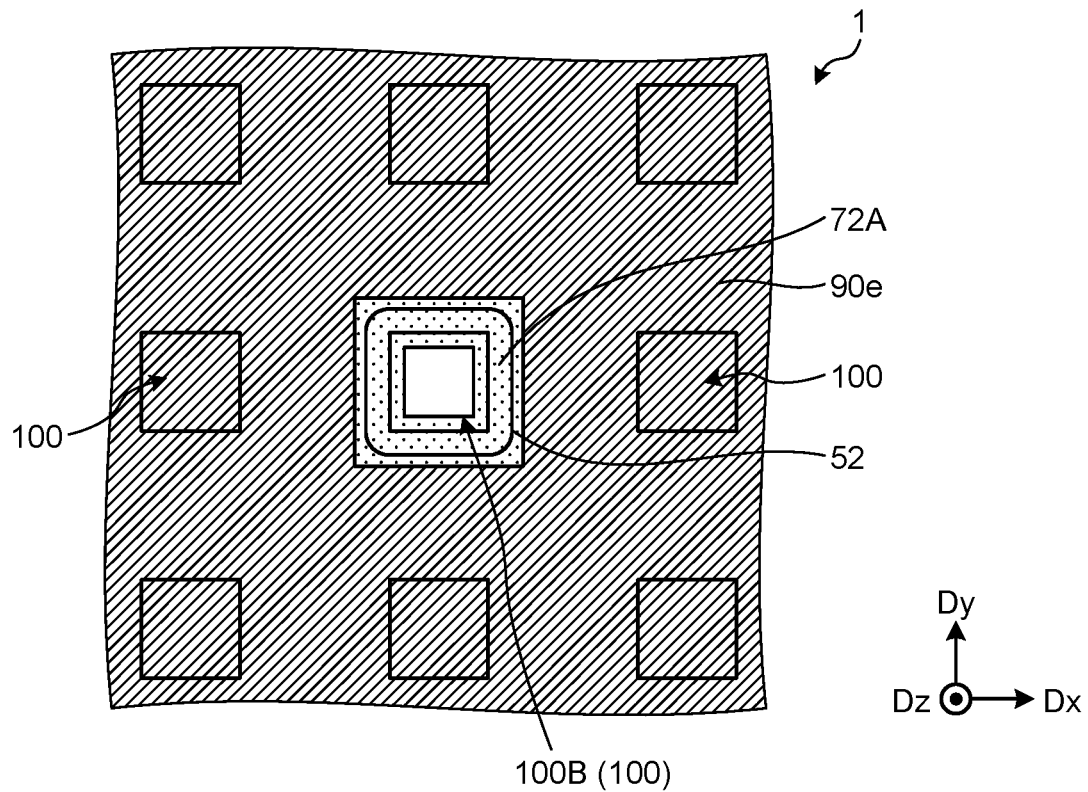
Figure 14A:
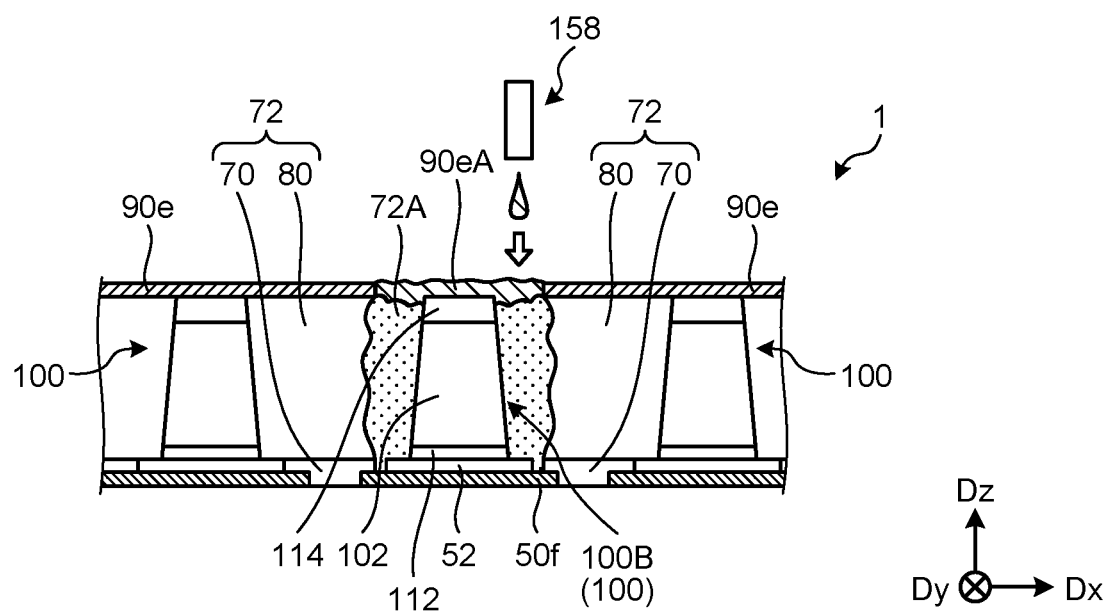
FIGS. 14A and 14B are views for schematically explaining a process of forming an alternative conductor.
Figure 14B:
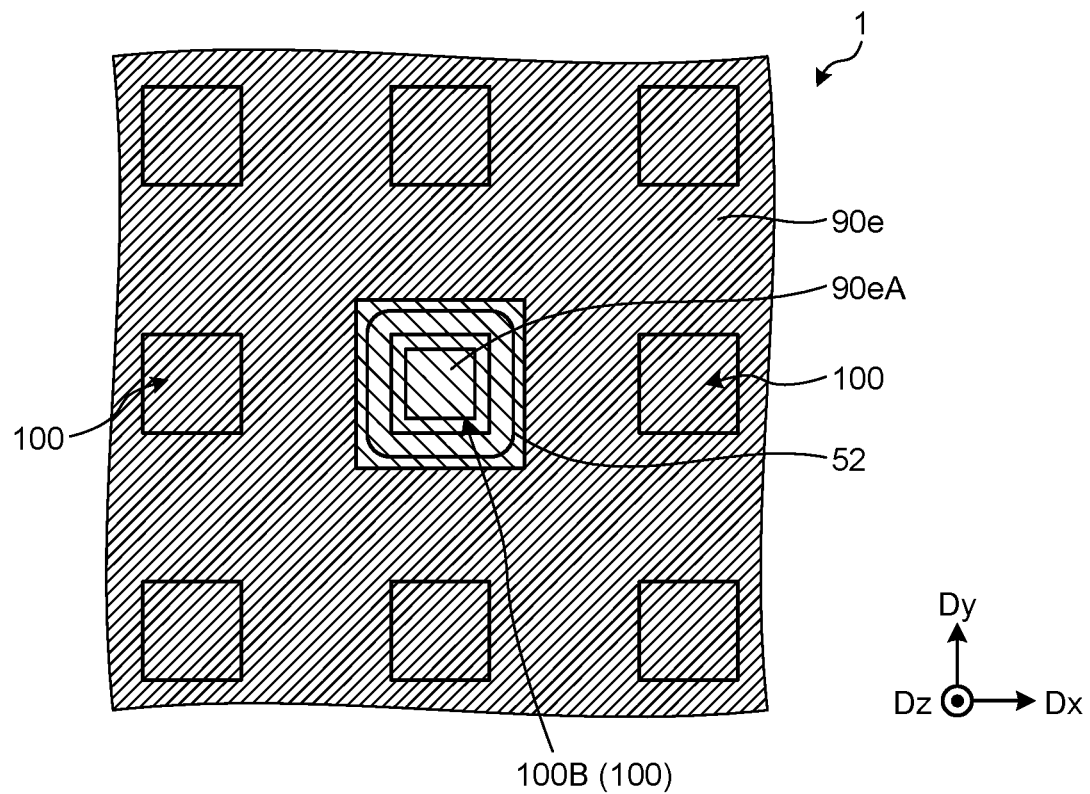

After the alternative inorganic light emitting body 100B is mounted, an alternative insulator 72A and an alternative conductor 90eA are formed around the alternative inorganic light emitting body 100B, as illustrated in FIG. 6 (step S26). FIGS. 13A and 13B are views for schematically explaining a process of forming the alternative insulator and FIGS. 14A and 14B are views for schematically explaining a process of forming the alternative conductor. As illustrated in FIG. 13A, after the alternative inorganic light emitting body 100B is mounted above the coupling conductive part 52, the alternative insulator 72A is formed around the alternative inorganic light emitting body 100B, in other words, in a space (in a space formed by removal of the insulator 72) in which the insulator 72 was provided in the space AR. The alternative insulator 72A is filled such that the cathode electrode 114 of the alternative inorganic light emitting body 100B remains in an exposed state. The alternative insulator 72A is made of an insulating material and is made of, for example, insulating resin. In the example of FIGS. 13A and 13B, for example, an insulator supply device 156 ejects the paste-like alternative insulator 72A to fill the space around the alternative inorganic light emitting body 100B with the alternative insulator 72A such that the cathode electrode 114 of the alternative inorganic light emitting body 100B remains in the exposed state, and the filled alternative insulator 72A is hardened.

After the alternative insulator 72A is formed, as illustrated in FIG. 14A, the alternative conductor 90eA is formed above the cathode electrode 114 of the alternative inorganic light emitting body 100B. To be more specific, the alternative conductor 90eA is formed so as to couple the cathode electrode 114 of the alternative inorganic light emitting body 100B and the counter cathode electrode 90e remaining unremoved via the alternative conductor 90eA, in other words, so as to make contact with both of the cathode electrode 114 of the alternative inorganic light emitting body 100B and the counter cathode electrode 90e remaining unremoved. The alternative conductor 90eA is a conductive member and is, for example, conductive resin (polymer) or pastes of conductive metal. In the example of FIGS. 14A and 14B, for example, a conductor supply device 158 ejects the paste-like alternative conductor 90eA such that the alternative conductor 90eA makes contact with both of the cathode electrode 114 of the alternative inorganic light emitting body 100B and the counter cathode electrode 90e, and the ejected alternative conductor 90eA is hardened. The alternative inorganic light emitting body 100B and the counter cathode electrode 90e are electrically coupled to each other via the alternative conductor 90eA by thus forming the alternative conductor 90eA.

With the formation of the alternative insulator 72A and the alternative conductor 90eA as described above, repairing of the display device 1 is finished. When it is determined that there is no defective inorganic light emitting body 100A (No at step S14) in FIG. 6, the processing is finished without performing repairing. When it is determined that the inorganic light emitting body 100 cannot be mounted again (No at step S22), the repairing processing is finished without mounting the alternative inorganic light emitting body 100B. In this case, the entire space AR formed by the removal of the alternative inorganic light emitting body 100B may be filled with the alternative insulator 72A. When there are defective inorganic light emitting bodies 100A, the pieces of processing at step S16 to step S26 illustrated in FIG. 6 are executed for each of the defective inorganic light emitting bodies 100A. After the above-mentioned repairing processing is finished, the cover portion 92 may be formed above the counter cathode electrode 90e.

As described above, the method for repairing the display device 1 in the embodiment is a method for repairing the display device 1 including the inorganic light emitting bodies 100 arrayed in a matrix with a row-column configuration and the insulator 72 provided around the inorganic light emitting bodies 100 and includes the detection step S14, the insulator removal step S18, and the inorganic light emitting body removal step S20. At the detection step S14, the defective inorganic light emitting body 100A as the inorganic light emitting body 100 having a defect is detected. At the insulator removal step S18, the insulator 72 around the defective inorganic light emitting body 100A is irradiated with the irradiation light LI to remove the insulator 72 around the defective inorganic light emitting body 100A while the inorganic light emitting body 100A remains unremoved. At the insulator removal step S18, the defective inorganic light emitting body 100A after the insulator 72 therearound has been removed is removed. In the display device including the inorganic light emitting bodies 100, a defect is generated in the inorganic light emitting bodies 100 in some cases. To address this, in the repairing method in the embodiment, the insulator 72 covering the surrounding of the defective inorganic light emitting body 100A is removed with the irradiation light LI, and then, the defective inorganic light emitting body 100A is removed from the display device 1. With this method, the defective inorganic light emitting body 100A in the bright spot state, for example, can be removed from the display device 1, thereby making the display device 1 into a usable state and preventing the yield from being lowered. The defective inorganic light emitting body 100A that has been removed can also be replaced by another inorganic light emitting body 100. The defect of the inorganic light emitting body 100 can thereby be eliminated to make the display device 1 into the usable state properly.

Furthermore, in repairing of the display device 1, it can be considered that the defective inorganic light emitting body 100A is also removed together with the insulator 72 by the irradiation with the irradiation light. That is to say, the defective inorganic light emitting body 100A can be blown away together with the insulator 72 by, for example, irradiating the insulator 72 with irradiation light having high energy. In this case, the position of the defective inorganic light emitting body 100A that has been blown away cannot, however, be grasped, and there are concerns in manufacturing, such as the defective inorganic light emitting body 100A remaining at an inappropriate place on the display device 1 and increase in time taken for finding the defective inorganic light emitting body 100A. By contrast, in the embodiment, the insulator 72 is removed by the irradiation with the irradiation light LI while the defective inorganic light emitting body 100A remains, thereby preventing occurrence of the problem that the defective inorganic light emitting body 100A is blown away and the position thereof cannot be found. Furthermore, the defective inorganic light emitting body 100A can be easily taken out with the tool 152, for example, by removing the insulator 72 around the defective inorganic light emitting body 100A by the irradiation with the irradiation light LI. As described above, the embodiment enables the display device 1 to be appropriately repaired.

At the insulator removal step S18, the insulator 72 included in the target part AR1 is removed by irradiating the target part AR1 with the irradiation light LI. The target part AR1 is a part located on the outer side of the center part 100A1 of the defective inorganic light emitting body 100A in the radiation direction when seen from the traveling direction of the light emitted by the inorganic light emitting bodies 100, that is, the third direction Dz side and surrounding the center part 100A1. In the embodiment, by irradiating the insulator 72 on the outer side of the center part 100A1 of the defective inorganic light emitting body 100A with the irradiation light LI, the defective inorganic light emitting body 100A can be prevented from being blown away by the irradiation with the irradiation light LI while the center part 100A1 and the array substrate 2 (to be more specific, the coupling conductive part 52) are kept being bonded to each other. Furthermore, the circumference of the center part 100A1 is irradiated with the irradiation light LI, so that the insulator 72 around the defective inorganic light emitting body 100A is removed to enable the defective inorganic light emitting body 100A to be easily detached with the tool 152 or the like.

At the insulator removal step S18, the entire target part AR1 is irradiated with the irradiation light LI by moving, along the circumference of the center part 100A1 of the defective inorganic light emitting body 100A, the irradiation position at which the display device 1 is irradiated with the irradiation light LI. In the embodiment, the entire target part AR1 is irradiated with the irradiation light LI by scanning the irradiation light LI as described above, thereby properly removing the insulator 72 around the defective inorganic light emitting body 100A.

The irradiation light LI is preferably laser light having the wavelength of 216 nm to 316 nm. By setting the wavelength of the irradiation light LI to be in this range, the defective inorganic light emitting body 100A can be prevented from being blown away due to excessively increased intensity of the light.

In the embodiment, it is preferable that a mounting step S24 of mounting the inorganic light emitting body 100 (alternative inorganic light emitting body 100B) in the space from which the defective inorganic light emitting body 100A has been removed in the display device 1 be further included. Mounting of the alternative inorganic light emitting body 100B instead of the defective inorganic light emitting body 100A can eliminate the defect of the display device 1, such as that in the bright spot state and the dark spot state.

An end portion of the defective inorganic light emitting body 100A on the opposite side to the third direction Dz (the traveling direction of the emitted light), in this example, the anode electrode 112 thereof is fixed to the coupling conductive part 52 that is coupled the electrode (counter anode electrode 50e). At the inorganic light emitting body removal step S18, the defective inorganic light emitting body 100A is detached from the coupling conductive part 52, so that the defective inorganic light emitting body 100A is removed while the coupling conductive part 52 remains. At the mounting step S24, the alternative inorganic light emitting body 100B is fixed to the coupling conductive part 52 by mounting the alternative inorganic light emitting body 100B above the coupling conductive part 52, emitting the irradiation light LJ toward the coupling conductive part 52 to cause the coupling conductive part 52 to be molten, and then, hardening the coupling conductive part 52. In the embodiment, the alternative inorganic light emitting body 100B is thus fixed to the coupling conductive part 52, so that the alternative inorganic light emitting body 100B can be properly mounted and the defect of the display device 1 can be eliminated.

Other action effects provided by the mode described in the embodiment that are obvious from description of the present specification or at which those skilled in the art can appropriately arrive should be interpreted to be provided by the present disclosure.

What is claimed is:

1. A method for repairing a display device, the display device including a plurality of inorganic light emitting elements arranged in a matrix, an insulator arranged around the plurality of inorganic light emitting elements, and a counter cathode electrode covering upper surfaces of the plurality of inorganic light emitting elements, the method comprising steps of:
detecting a defective inorganic light emitting element as the inorganic light emitting element having a defect;

removing a portion of the counter cathode electrode over the defective inorganic light emitting element and a portion of the insulator around the defective inorganic light emitting element while the defective inorganic light emitting element remains without being removed by irradiating the insulator around the defective inorganic light emitting element with irradiation light;

removing the defective inorganic light emitting element after the portion of the insulator therearound has been removed;

mounting an inorganic light emitting element in a space from which the defective inorganic light emitting element is removed in the display device, and connecting an electrode on an upper surface of the inorganic light emitting element mounted on the space and the counter cathode electrode around the inorganic light emitting element by an alternative conductor.

2. The method according to claim 1, wherein at the removing of the insulator, the insulator included in a target part located on an outer side of a center part of the defective inorganic light emitting element in a radiation direction and surrounding the center part when seen from a traveling direction of light emitted from the inorganic light emitting elements is removed by irradiating the target part with the irradiation light.

3. The method according to claim 2, wherein at the removing of the insulator, the entire target part is irradiated with the irradiation light by moving an irradiation position at which the display device is irradiated with the irradiation light along a circumference of the center part of the defective inorganic light emitting element.

4. The method according to claim 1, wherein the irradiation light is laser light having a wavelength of 216 nm to 316 nm.

5. The method according to claim 1, wherein an end portion of the defective inorganic light emitting element on an opposite side to a traveling direction of light emitted from the inorganic light emitting elements is fixed to a coupling conductive part that is coupled to an electrode, at the removing of the inorganic light emitting element, the defective inorganic light emitting element is removed while the coupling conductive part remains by detaching the defective inorganic light emitting element from the coupling conductive part, and at the mounting, the inorganic light emitting element is fixed to the coupling conductive part by mounting the inorganic light emitting element above the coupling conductive part, emitting the irradiation light toward the coupling conductive part to cause the coupling conductive part to be molten, and then, hardening the coupling conductive part.

6. The method according to claim 1, further comprising a step of forming an alternative insulator around the inorganic light emitting element after mounting the inorganic light emitting element in the space from which the defective inorganic light emitting element is removed in the display device, and before connecting an electrode on an upper surface of the inorganic light emitting element and the counter cathode electrode.

\* \* \* \* \*